United States Patent [19]

Mochizuki et al.

[11] Patent Number: 5,679,973
[45] Date of Patent: Oct. 21, 1997

[54] LATERAL HALL ELEMENT

[75] Inventors: Hiroshi Mochizuki, Tokyo; Kanae Fujii, Yokohama; Hideyuki Funaki, Tokyo, all of Japan

[73] Assignee: Kabushiki Kaisha Toshiba, Kawasaki, Japan

[21] Appl. No.: 624,103

[22] Filed: Mar. 29, 1996

[30] Foreign Application Priority Data

Mar. 30, 1995 [JP] Japan ................................. 7-072681
Jul. 14, 1995 [JP] Japan ................................. 7-178779

[51] Int. Cl.[6] .......................... H01L 29/82; H01L 43/00
[52] U.S. Cl. .................... 257/421; 257/423; 257/427; 73/514.08; 73/514.31; 73/DIG. 3; 324/207.2
[58] Field of Search .................................. 257/421, 423, 257/427; 73/DIG. 3, 514.08, 514.31; 324/207.2

[56] References Cited

U.S. PATENT DOCUMENTS

| | | | |
|---|---|---|---|
| 4,782,375 | 11/1988 | Popovic | 357/27 |
| 4,829,352 | 5/1989 | Popovic et al. | 357/27 |
| 4,939,563 | 7/1990 | Fang et al. | 257/423 |
| 4,987,467 | 1/1991 | Popovic | 357/27 |
| 5,099,298 | 3/1992 | Nakamura et al. | 257/423 |
| 5,179,429 | 1/1993 | Ristic | 257/423 X |
| 5,323,050 | 6/1994 | Ristic | 257/423 X |
| 5,530,345 | 6/1996 | Murari et al. | 257/427 X |

Primary Examiner—William Mintel
Attorney, Agent, or Firm—Oblon, Spivak, McClelland, Maier & Neustadt, P.C.

[57] ABSTRACT

A lateral Hall element includes a substrate, a first-conductivity type active layer formed on the substrate, a first second-conductivity type semiconductor layer formed to surround the first-conductivity type active layer and formed to a depth to reach the substrate, a pair of first first-conductivity type semiconductor layers of high impurity concentration selectively formed with a preset distance apart from each other on the surface of the first-conductivity type active layer, current supply electrodes respectively formed on the pair of first first-conductivity type semiconductor layers, a pair of second first-conductivity type semiconductor layers of high impurity concentration formed with a preset distance apart from each other on the surface of the first-conductivity type active layer in position different from the first first-conductivity type semiconductor layers, sensor electrodes respectively formed on the pair of second first-conductivity type semiconductor layers, and a plurality of second second-conductivity type semiconductor layers formed on the surface of the first-conductivity type active layer in position different from the first and second first-conductivity type semiconductor layers.

19 Claims, 20 Drawing Sheets

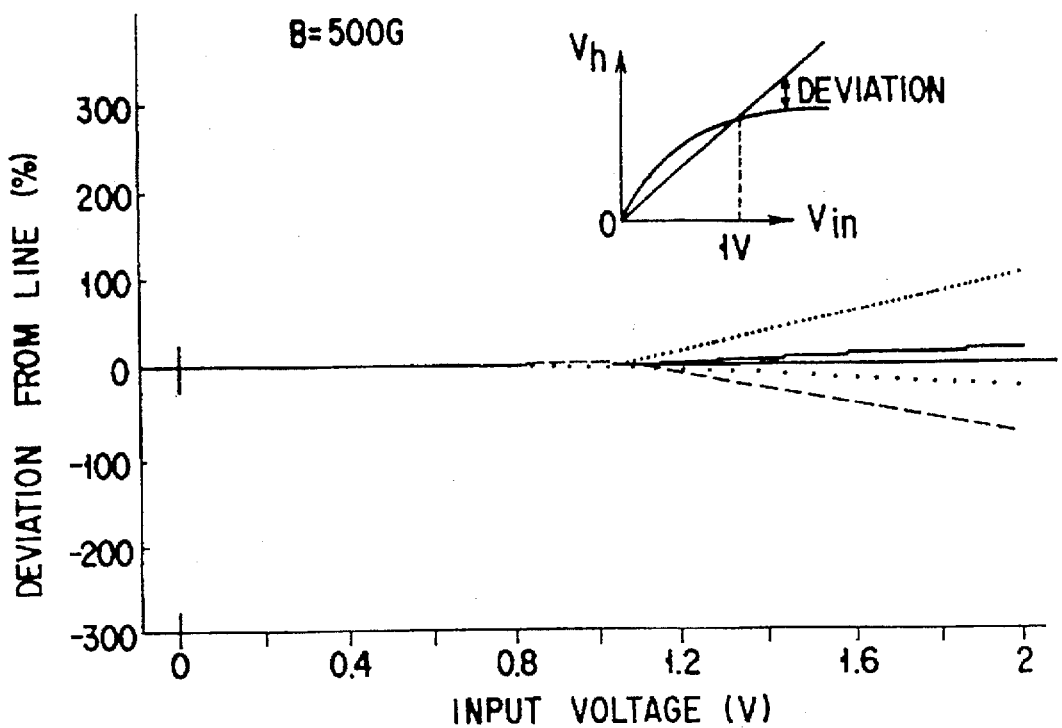
FIG. 3 PRIOR ART  —VinB  ---- -VinB  ··Vin-B  --- -Vin-B
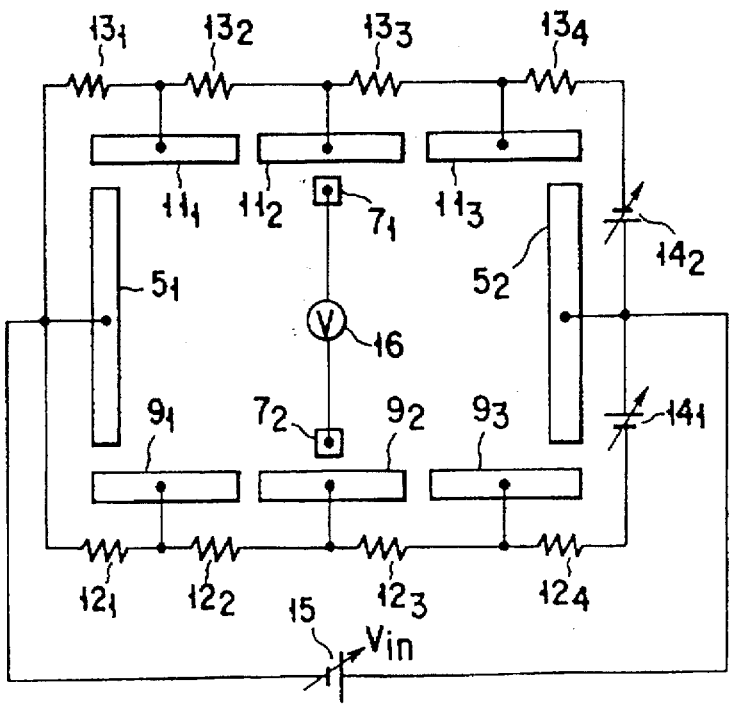
FIG. 5

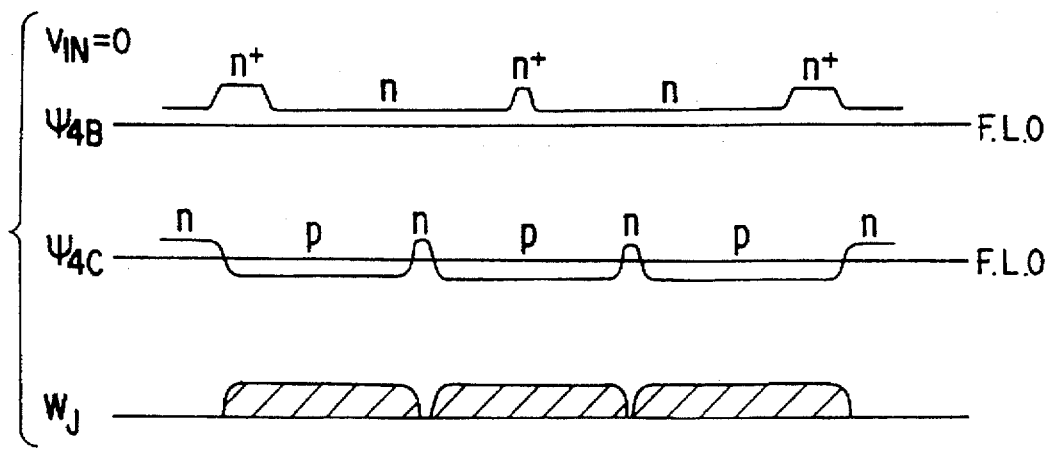
F I G. 6A
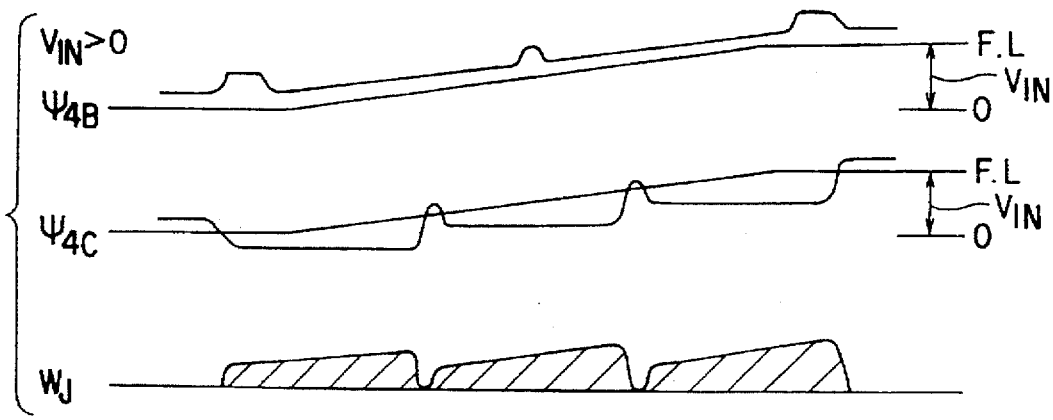
F I G. 6B
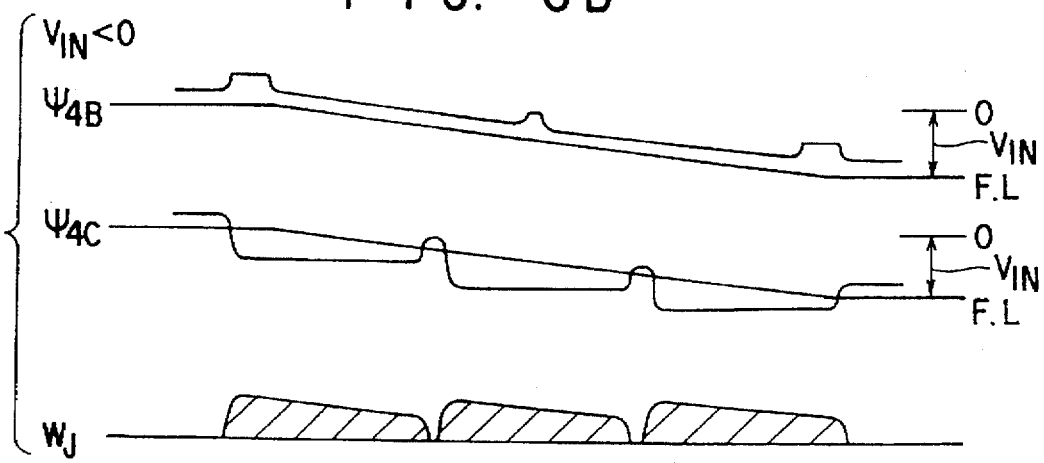
F I G. 6C

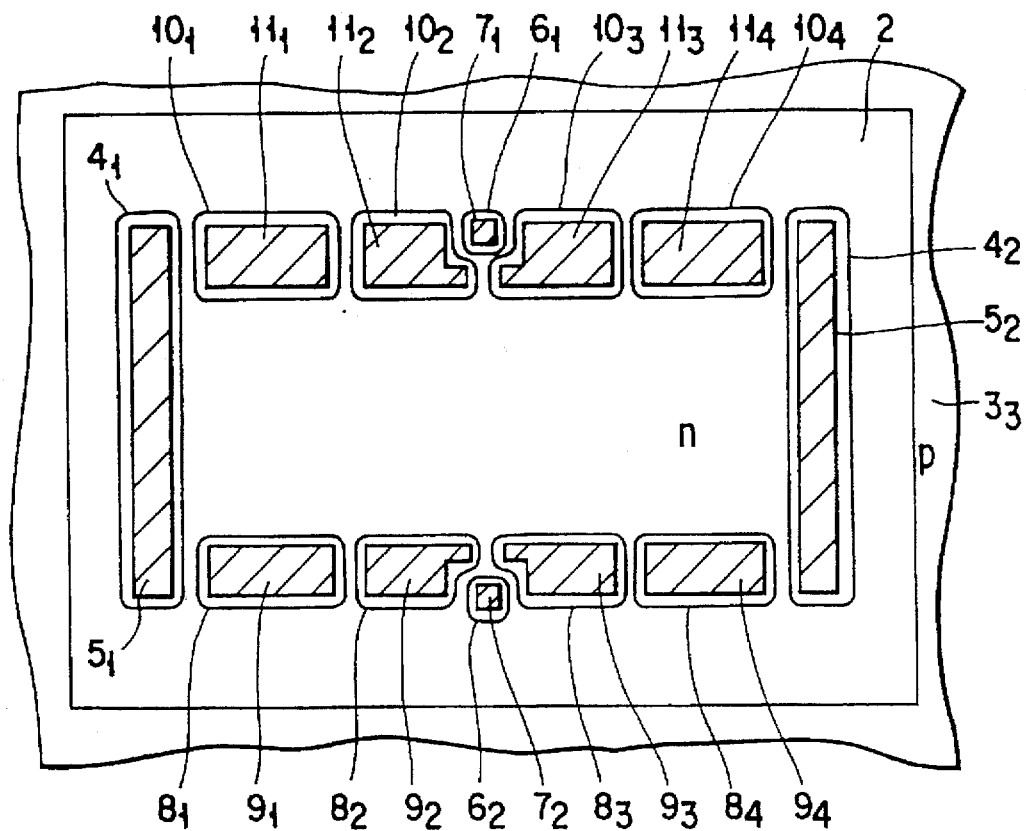
F I G. 7
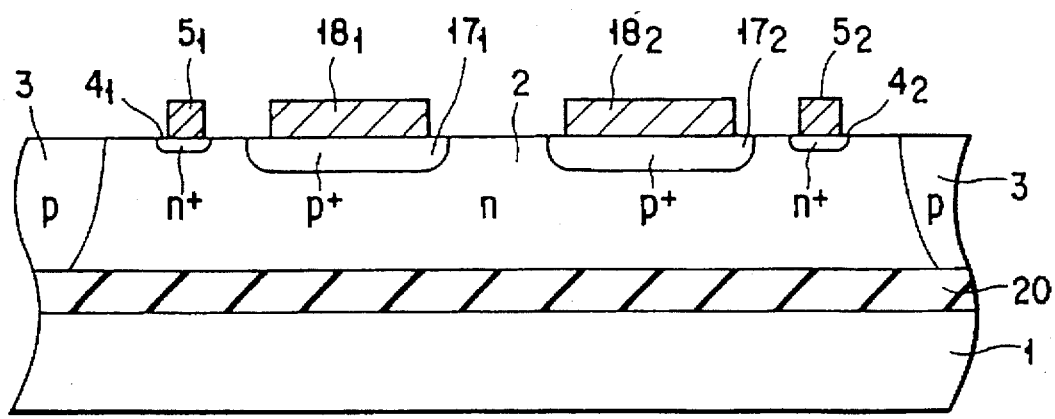
F I G. 9

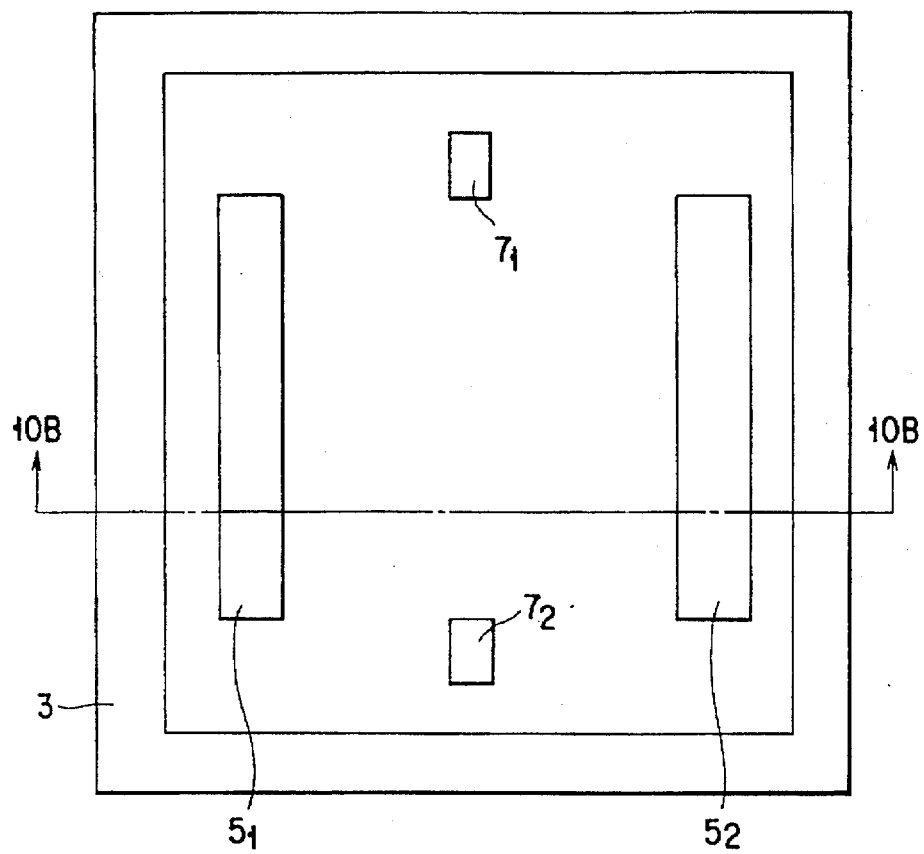
F I G. 10 A
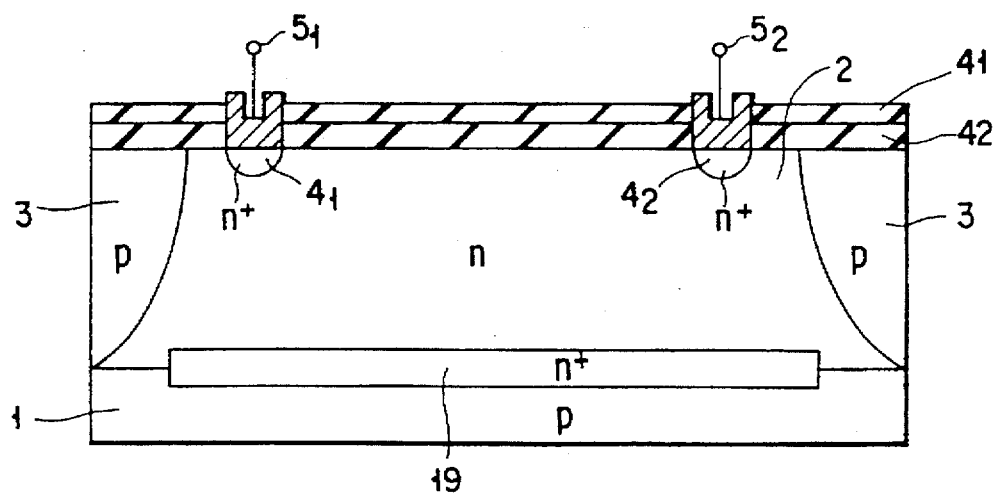
F I G. 10 B

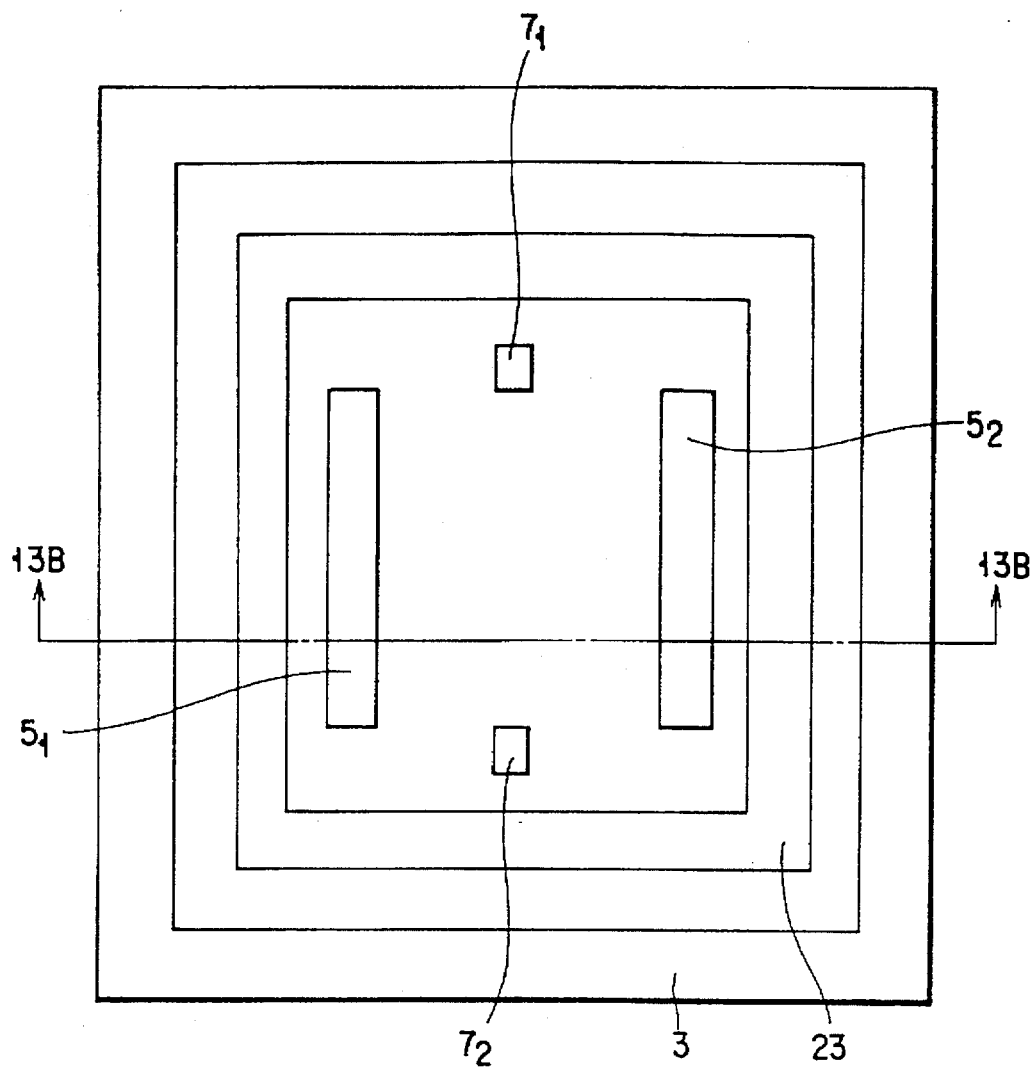
F I G. 13A
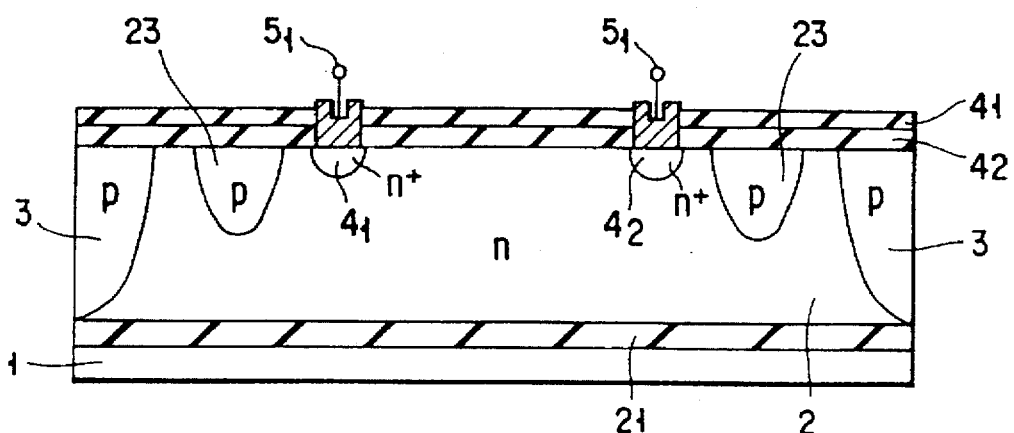
F I G. 13B

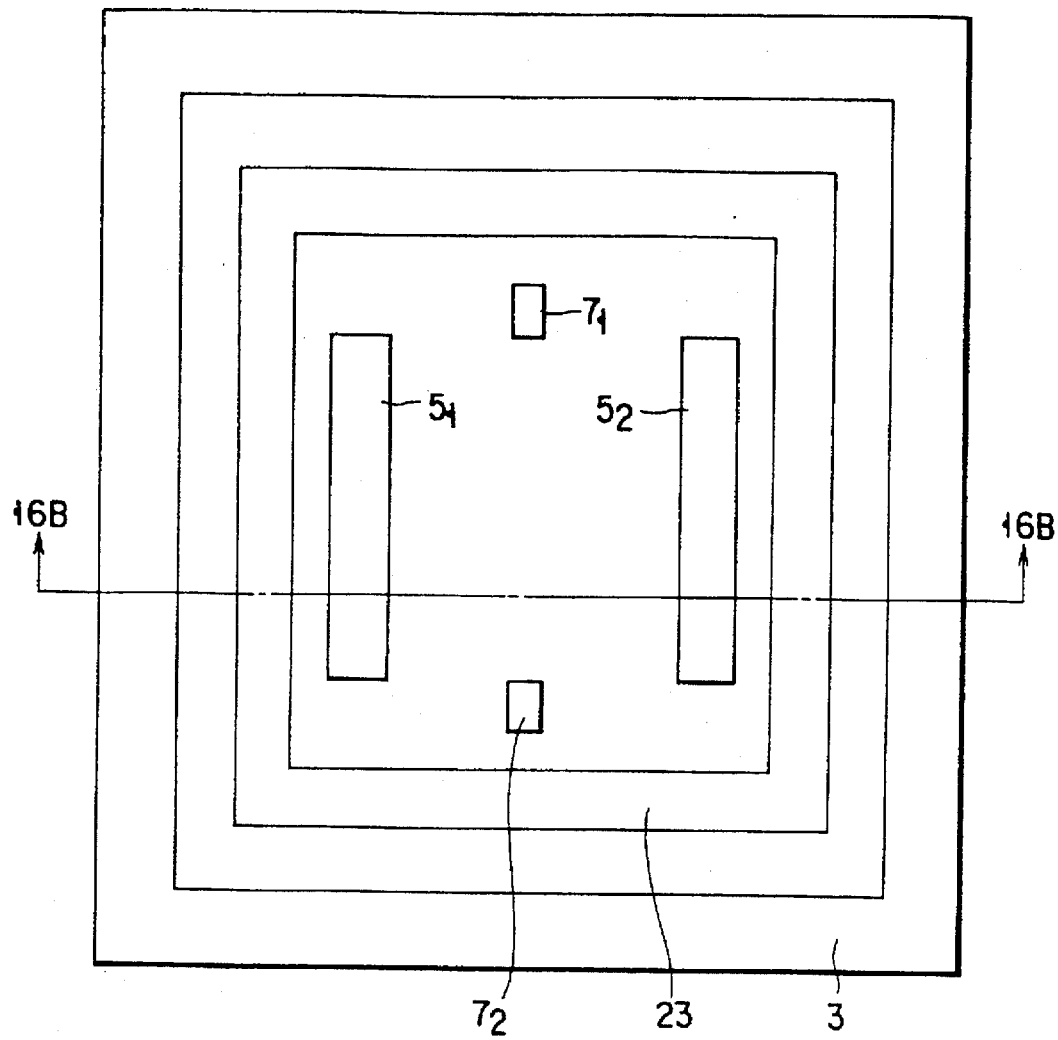
F I G. 16A
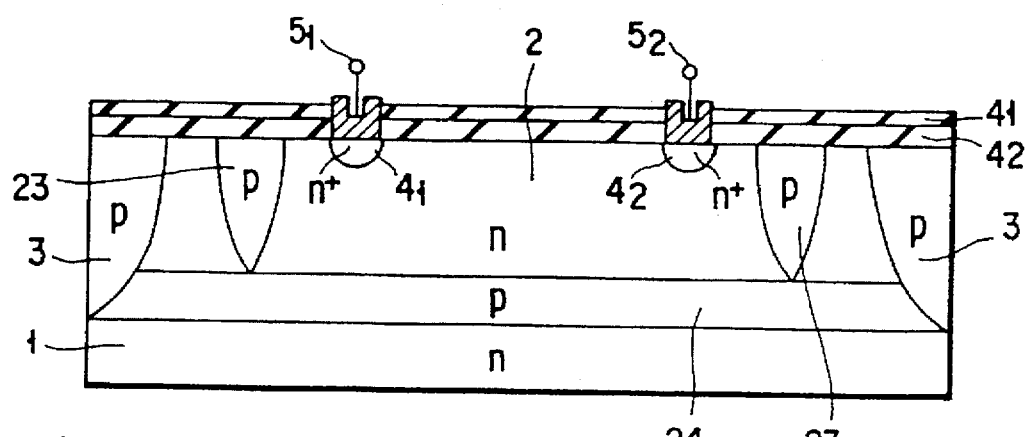
F I G. 16B

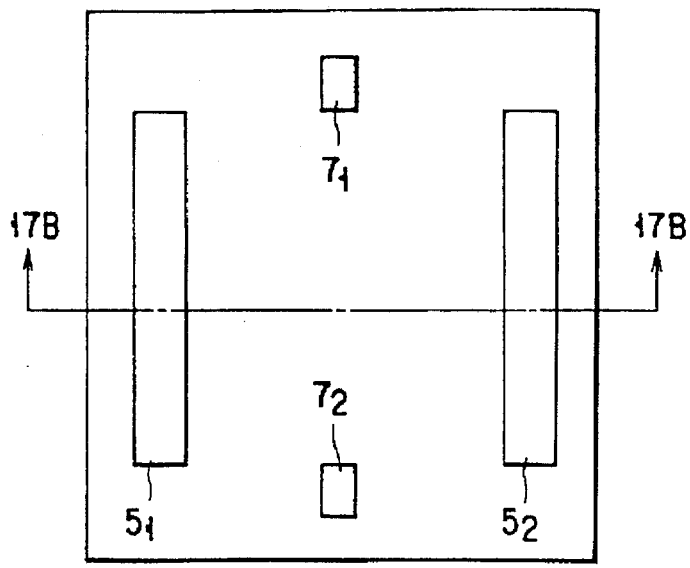
F I G. 17A
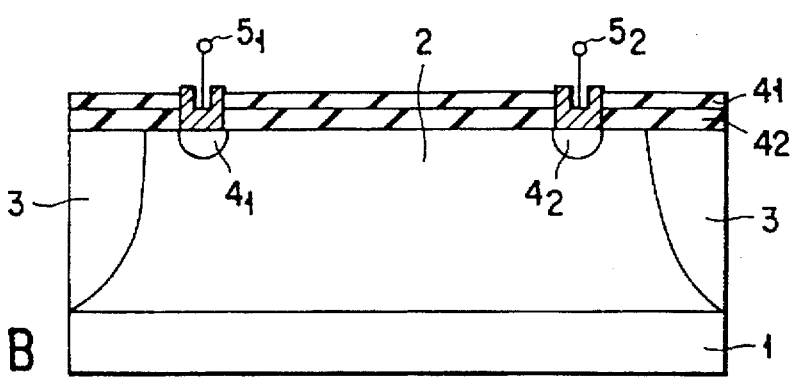
F I G. 17B
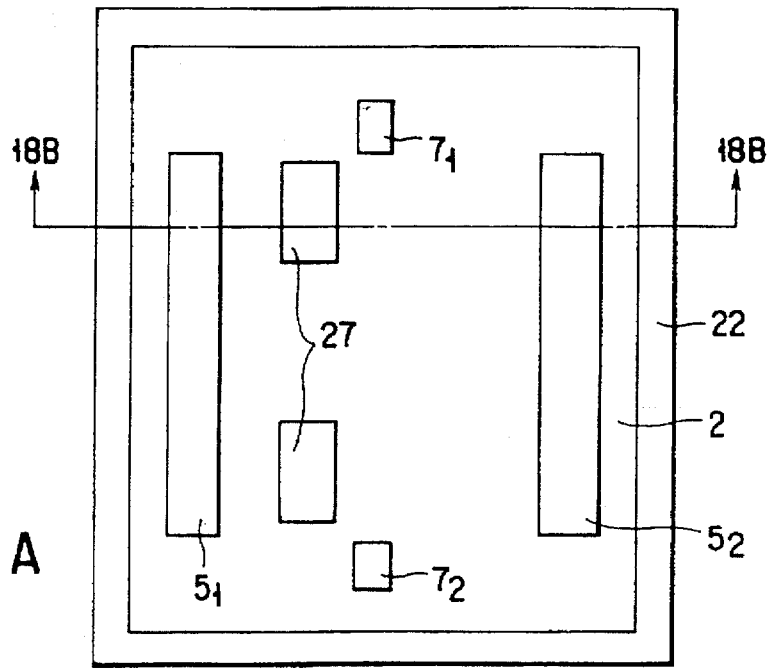
F I G. 18A

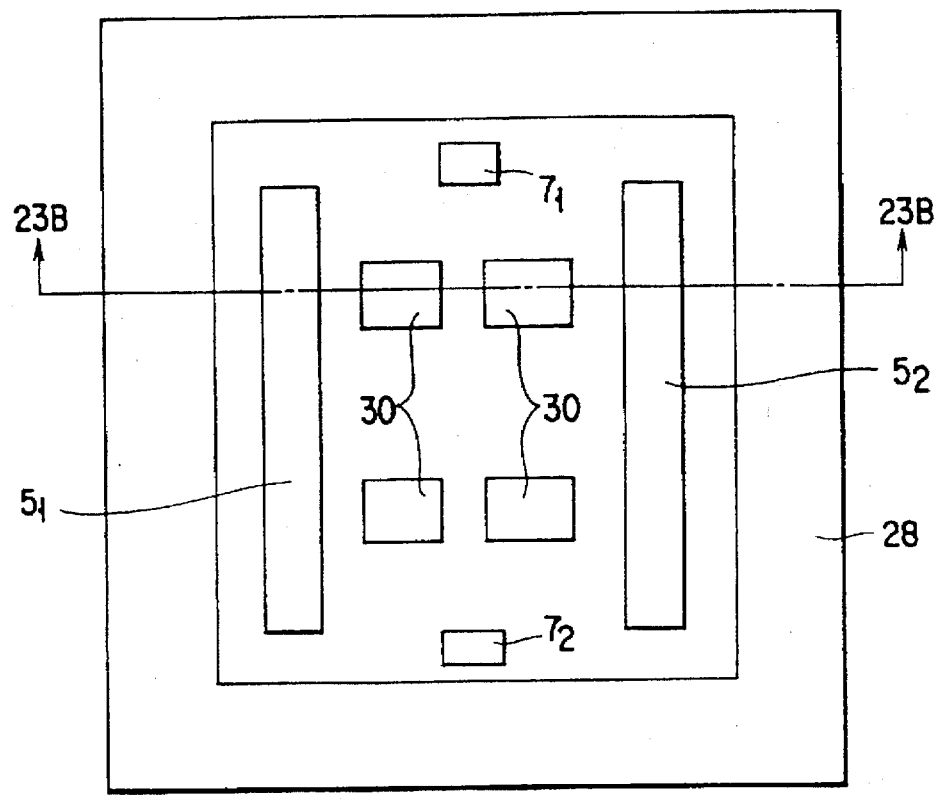
F I G. 23A
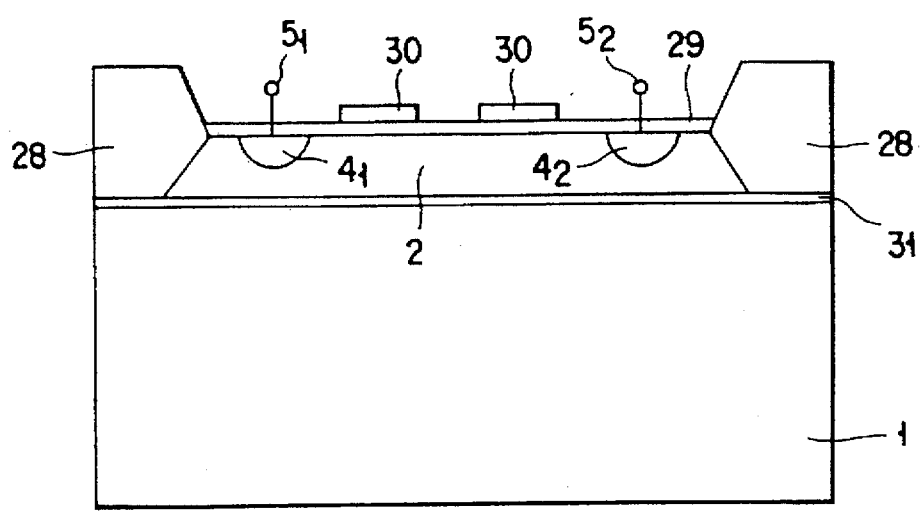
F I G. 23B

LATERAL HALL ELEMENT

BACKGROUND OF THE INVENTION

1. Field of the Invention

This invention relates to a lateral Hall

2. Description of the Related Art

FIG. 1A is a top plan view of a conventional lateral Hall element having four terminals, and FIG. 1B is a cross sectional view taken along the line 1B—1B of the lateral Hall element shown in FIG. 1A. FIG. 1C is a cross sectional view taken along the line 1C—1C of the lateral Hall element shown in FIG. 1A. As shown in FIGS. 1A to 1C, an n-type active layer 2 is formed on a $p^{31}$-type silicon substrate 1. The active layer 2 is surrounded by a p-type layer 3 which is formed to such a depth as to reach the substrate 1 and thus the active layer is isolated from the other region. Further, a pair of $n^+$-type layers $4_1$, $4_2$ are formed to face each other on the surface of the active layer 2. A current supply electrode $5_1$ is formed on the $n^+$-type layer $4_1$1, and a current supply electrode $5_2$ is formed on the $n^+$-type layer 42. A pair of $n^+$-type layers $6_1$, $6_2$ are formed to face each other on the surface of the active layer 2 in a position different from the $n^+$-type layers $4_1$, $4_2$, a sensor electrode $7_1$ is formed on the $n^+$-type layer $6_1$, and a sensor electrode $7_2$ is formed on the $n^+$-type layer $6_2$.

If a current is caused to flow between the current supply electrodes 51 and 52 to in parallel to the surface portion of the active layer 2 and a magnetic field is applied to the surface of the active layer 2 in a direction perpendicular to the currents, a Hall voltage $V_h$ is induced by the principle of Lorentz between the two sensor electrodes $7_1$ and $7_2$.

The above lateral Hall element can be manufactured at a low cost by use of the planar technique which is a manufacturing method for integrated circuits since the terminals of the current supply electrodes and sensor electrodes are formed on the surface of the semiconductor layer. Further, in order to reduce an offset voltage occurring when no magnetic field is present, a plurality of lateral Hall elements arranged with an inclination angle of 90 degrees with each other on the same substrate and the orthogonal connection for connecting the current supply electrodes and the sensor electrodes of the respective elements in parallel is used in some cases. When the orthogonal connection is applied, it is necessary to isolate the lateral Hall elements from each other, and the lateral Hall element shown in FIGS. 1A to 1C has such a structure as to be very easily isolated from the other elements.

Now, a case wherein a voltage $V_{in}$ is applied between the current supply electrodes $5_1$ and $5_2$ of the above lateral Hall element is considered. FIGS. 2A to 2C are characteristic diagrams showing the potential distribution $\Psi_{1B}$ on the cross section taken along the line 1B—1B of FIG. 1A, the potential distribution $\Psi_D$ on the cross section taken along the line D—D of FIG. 1A, and the width $W_j$ of a depletion layer in the pn junction portion between the active layer 2 and the p-type layer 3 when $V_{in}$ is set to 0, positive value and negative value, respectively. FIG. 2A shows a case of $V_{in}=0$, FIG. 2B shows a case of $V_{in}>0$, and FIG. 2C shows a case of $V_{in}<0$. In order to prevent a current from flowing in the pn junction portion in the case of $V_{in}<0$, it is necessary to apply a negative bias voltage to the p-type layer 3.

In the case of $V_{in}=0$, a level of the potential 0 coincides with the Fermi level (F.L.) on the cross section taken along the line 1B—1B, $\Psi_{1B}$ is positive in the entire region, high in the $n^+$-type layers $4_1$, $4_2$, $6_1$ and low in the active layer 2. On the cross section taken along the line D—D, F.L. is lower than the potential 0 by an amount indicated by $V_R$ and $\Psi_D$ becomes lower than the F.L. In this case, $W_j$ is constant.

In the case of $V_{in}>0$, F.L. on the current supply electrode $5_2$ side on the cross section taken along the line 1B—1B becomes higher than the potential 0 by an amount indicated by $V_{in}$, and $\Psi_{1B}$ is higher than the F.L. in the entire region. For this reason, the width $W_j$ of the depletion layer is widened by an amount corresponding to a rise of the F.L. The potential distribution $\Psi_D$ on the line D—D is the same as that in the case of $V_{in}=0$.

In the case of $V_{in}<0$, the potential distribution and a variation in the width of the depletion layer are reversed with respect to those in the case of $V_{in}>0$. As is understood from FIGS. 2B and 2C, the depletion layer is widened when $V_{in}$ is positive and narrowed when $V_{in}$ is negative.

For example, a case wherein a voltage of −2 V is applied to the p-type layer 3 and a voltage of ±2 V is applied to the current supply electrode 5 is considered. If the width $W_j$ of the depletion layer at the time of voltage 0 is 0.7 μm, $W_j$ obtained when the voltage is applied greatly varies and is set to 1.79 μm. Further, the expansion of the depletion layer is also changed by the Hall voltage $V_h$. In FIGS. 2A to 2C, variations in the width of the depletion layer of the pn junction portion between the active layer 2 and the p-type layer 3 are shown, but the width of the depletion layer of the pn junction portion between the substrate 1 and the active layer 2 is also changed since a bias voltage is applied to the pn junction portion between the substrate 1 and the active layer 2. Such a variation in the width of the depletion layer causes a variation in the width of the current path, that is, a variation in the resistance of the element, thereby causing a problem that the linearity between the Hall sensitivity and the magnetic field cannot be maintained. FIG. 3 is a diagram showing a deviation in the Hall voltage $V_h$ from a reference line with respect to an input voltage by using a line connecting a point indicating the Hall voltage $V_h$ obtained when the input voltage is 1 V to an origin as the reference line in the lateral Hall element shown in FIGS. 1A to 1C. As shown in FIG. 3, a deviation in the Hall voltage $V_h$ is rapidly increased in proportion to an increase in the input voltage.

Further, when a voltage of ±2 V is applied and if the width of the element is set to approx. 100 μm, the resistance of the element varies by several %.

In order to prevent the variation in the resistance, for example, a method for forming a p-type layer on the surface of part of the active layer 2 and feeding a voltage applied to the p-type layer back to $V_{in}$ or $V_h$ to reduce a variation in the width of the depletion layer is provided. However, with this method, it is necessary to use a complicated external circuit and there occurs a problem that it is impossible to respond to an extremely high-speed variation in the voltage $V_{in}$.

Further, when the lateral Hall element is used for detection of electric power of a watt-hour meter or the like, it becomes necessary to alternately apply positive and negative voltages to a pair of current supply electrodes of one lateral Hall element since the electric power is an AC power. That is, the direction of a current flowing between the pair of current supply electrodes is changed according to the frequency of the AC power. Further, in a case where positive and negative voltages applied between the current supply electrodes are different in the absolute value, the extensions of depletion layers formed in the junction portions between the active layer and the substrate and element isolation region are changed at the time of application of positive and negative voltages, and therefore, the Hall characteristic is changed. That is, the dependencies of the Hall characteristic on the polarity of the voltage and on the absolute value of the voltage occur. In this case, it is considered to suppress the above influence by increasing the thickness of the active layer, but the current component contributing to the Hall voltage $V_h$ induced at this time is reduced and the Hall sensitivity is lowered. Further, when the thickness of the active layer is made extremely large, the element isolation diffusion becomes far from realistic and the side diffusion by the element isolation diffusion becomes larger to exert an influence on the precision of the pattern shape of the lateral Hall element.

On the other hand, as a factor which determines the performance of the lateral Hall element, there is an offset voltage occurring when no magnetic field is present as described before. It is considered that the cause of generation of the offset voltage is the unbalance of a four-terminal bridge constructed by two current supply electrodes and two sensor electrodes in the lateral Hall element. For example, if the resistances between the current supply electrodes and the sensor electrodes are equal to each other, a voltage between the sensor electrodes becomes 0, but if the resistances are different from each other, a certain voltage occurs. It is well known in the art that a deviation in the resistances is caused by the dissymmetry of the current supply electrodes and the sensor electrodes or partial variation in the resistances by the piezo resistance effect occurring in the Si crystal by a stress applied to the lateral Hall element from the exterior. In order to suppress this type of offset voltage, various proposals have been made. The orthogonal connection is one of the effective methods. However, with this method, it is necessary to form a plurality of Hall elements and the offset voltage cannot be completely eliminated. It is difficult to directly adjust the offset voltage from the exterior once the offset voltage is generated.

As described above, in the conventional lateral Hall element, the extensions of depletion layers from the substrate and element isolation region towards the active layer are varied to deteriorate the linearity of the Hall sensitivity and it is difficult to compensate for an offset voltage caused by a deviation in the resistances of the four-terminal bridge constructed by a pair of current supply electrodes and a pair of sensor electrodes.

SUMMARY OF THE INVENTION

An object of this invention is to provide a lateral Hall element which is excellent in the linearity of the Hall sensitivity in comparison with the conventional lateral Hall element and which can adequately attain the offset compensation.

In order to attain the above object, a lateral Hall element according to this invention comprises a substrate; a first-conductivity type active layer formed on the substrate; a first second-conductivity type semiconductor layer formed to surround the first-conductivity type active layer and formed to a depth to reach the substrate; a pair of first first-conductivity type semiconductor layers of high impurity concentration selectively formed with a preset distance apart from each other on the surface of the first-conductivity type active layer; current supply electrodes respectively formed on the pair of first first-conductivity type semiconductor layers; a pair of second first-conductivity type semiconductor layers of high impurity concentration formed with a preset distance apart from each other on the surface of the first-conductivity type active layer in position different from the first first-conductivity type semiconductor layers; sensor electrodes respectively formed on the pair of second first-conductivity type semiconductor layers; and a plurality of second second-conductivity type semiconductor layers formed on the surface of the first-conductivity type active layer in position different from the first and second first-conductivity type semiconductor layers.

The potentials of portions of the first-conductivity type active layer which lie around the second second-conductivity type semiconductor layers can be made substantially constant by respectively applying potentials to the plurality of second second-conductivity type semiconductor layers. Therefore, the width of the depletion layer extending from the first second-conductivity type semiconductor layer which is an element isolation region to the first-conductivity type active layer can be made independent from an input voltage and the linearity of the Hall sensitivity, that is, the dependency of the Hall sensitivity on the input voltage can be maintained.

Further, a second lateral Hall element according to this invention comprises a second-conductivity type substrate; a first-conductivity type active layer formed on the substrate; a second-conductivity type semiconductor layer formed to surround the first-conductivity type active layer and formed to a depth to reach the substrate; a pair of first first-conductivity type semiconductor layers of high impurity concentration selectively formed with a preset distance apart from each other on the surface of the first-conductivity type active layer; current supply electrodes respectively formed on the pair of first first-conductivity type semiconductor layers; a pair of second first-conductivity type semiconductor layers of high impurity concentration formed with a preset distance apart from each other on the surface of the first-conductivity type active layer in position different from the first first-conductivity type semiconductor layer; sensor electrodes respectively formed on the pair of second first-conductivity type semiconductor layers; and a third first-conductivity type semiconductor layer having a resistance lower than the first-conductivity type active layer and formed selectively or entirely between the first-conductivity type active layer and the substrate.

The extension of the depletion layer from the substrate to the first-conductivity type active layer can be suppressed by forming the third first-conductivity type semiconductor layer having a resistance lower than the first-conductivity type active layer between the first-conductivity type active layer and the substrate and the dependency of the Hall sensitivity on the input voltage, the dependency of the offset voltage on the input voltage and the dependency of the input voltage on the polarity can be improved.

Further, a third lateral Hall element according to this invention comprises a substrate; a first-conductivity type active layer formed on the substrate; a pair of first first-conductivity type semiconductor layers of high impurity concentration selectively formed with a preset distance apart from each other on the surface of the first-conductivity type active layer; current supply electrodes respectively formed on the pair of first first-conductivity type semiconductor layers; a pair of second first-conductivity type semiconductor layers of high impurity concentration formed with a preset distance apart from each other on the surface of the first-conductivity type active layer in position different from the first first-conductivity type semiconductor layers; sensor electrodes respectively formed on the pair of second first-conductivity type semiconductor layers; an element isolation layer formed to surround the first-conductivity type active layer and formed to a depth to reach the substrate; and an insulating film formed between the first-conductivity type active layer and the substrate.

The element isolation layer is formed of an insulating material or a second second-conductivity type semiconductor layer, for example. Further, it is preferable to set the thickness of the first-conductivity type active layer in a range of 0.5 to 9 µm and set the thickness of the insulating film in a range of 0.3 to 2 µm.

The extension of the depletion layer from the substrate to the first-conductivity type active layer can be stably suppressed by forming the element isolation layer formed of an insulating material or a second-conductivity type semiconductor layer to surround the first-conductivity type active layer and forming a insulating film between the first-conductivity type active layer and the substrate. Therefore, the dependency of the Hall sensitivity on the input voltage, the dependency of the offset voltage on the input voltage and the dependency of the input voltage on the polarity can be improved. Further, preferable specific sensitivity can be obtained by setting the thickness of the first-conductivity type active layer in a range of 0.5 to 9 µm. Also, the operation of a parasitic MOS transistor can be suppressed and warping of the SOI wafer can be prevented by setting the thickness of the insulating film in a range of 0.3 to 2 µm.

Further, a fourth lateral Hall element according to this invention comprises a second-conductivity type substrate; a first-conductivity type active layer formed on the second-conductivity type substrate; a pair of first first-conductivity type semiconductor layers of high impurity concentration selectively formed with a preset distance apart from each other on the surface of the first-conductivity type active layer; current supply electrodes respectively formed on the pair of first first-conductivity type semiconductor layers; a pair of second first-conductivity type semiconductor layers of high impurity concentration formed with a preset distance apart from each other on the surface of the first-conductivity type active layer in position different from the first first-conductivity type semiconductor layers; sensor electrodes respectively formed on the pair of second first-conductivity type semiconductor layers; a third first-conductivity type semiconductor layer formed between the first-conductivity type active layer and the second-conductivity type substrate; and a first second-conductivity type semiconductor layer having a resistance lower than the first-conductivity type active layer and selectively formed on the third first-conductivity type semiconductor layer; wherein a second second-conductivity type semiconductor layer is formed to surround the first and second first-conductivity type semiconductor layers and formed from the surface of the first-conductivity type active layer to a depth to reach the first second-conductivity type semiconductor layer.

The extension of the depletion layer from the substrate to the first-conductivity type active layer can be suppressed by forming the first second-conductivity type semiconductor layer having a resistance lower than the first-conductivity type active layer and the second second-conductivity type semiconductor layer so as to surround a portion below the first-conductivity type active layer and the side surface thereof and forming all of the current supply electrodes and sensor electrodes on the surrounded portion of the first-conductivity type active layer with the first and second first-conductivity type semiconductor layers disposed therebetween. With this structure, the dependency of the Hall sensitivity on the input voltage can be improved as in the former case.

Further, a fifth lateral Hall element according to this invention comprises a substrate; a first-conductivity type active layer formed on the substrate; a pair of first first-conductivity type semiconductor layers of high impurity concentration selectively formed with a preset distance apart from each other on the surface of the first-conductivity type active layer; current supply electrodes respectively formed on the pair of first first-conductivity type semiconductor layers; a pair of second first-conductivity type semiconductor layers of high impurity concentration formed with a preset distance apart from each other on the surface of the first-conductivity type active layer in position different from the first first-conductivity type semiconductor layers; sensor electrodes respectively formed on the pair of second first-conductivity type semiconductor layers; a plurality of second-conductivity type semiconductor layers formed on the surface of the first-conductivity type active layer in position different from the first and second first-conductivity type semiconductor layers; gate electrodes respectively formed on the second-conductivity type semiconductor layers; an element isolation layer formed to surround the first-conductivity type active layer and formed to a depth to reach the substrate; and an insulating film formed between the first-conductivity type active layer and the substrate.

The second-conductivity type semiconductor layers are disposed in position apart from an intersection of a line connecting the centers of the pair of first first-conductivity type semiconductor layers and a line connecting the centers of the pair of second first-conductivity type semiconductor layers. More specifically, the second-conductivity type semiconductor layers are disposed in a position apart from a line connecting the centers of the pair of first first-conductivity type semiconductor layers and a line connecting the centers of the pair of second first-conductivity type semiconductor layers.

In this case, by forming one or more second second-conductivity type semiconductor layers for constructing junction gates on the surface of the first-conductivity type active layer and applying potentials to the second semiconductor layers, the depletion layer extends into the first-conductivity type active layer to change the current path so that adequate offset compensation can be attained in cooperation with the operation of suppressing the extension of the depletion layer from the substrate to the first-conductivity type active layer.

It is preferable to set the thickness of the first-conductivity type active layer in a range of 3.5 to 6 µm, and it is preferable to set the thickness of the second-conductivity type semiconductor layer to 1 µm or less. Further, it is preferable to set a difference between the thickness of the first-conductivity type active layer and the thickness of the second-conductivity type semiconductor layer in a range of 2 to 5 µm. Further, the element isolation layer is formed of an insulating material or a second second-conductivity type semiconductor layer, for example.

A lowering in the sensitivity can be prevented by setting the thickness of the first-conductivity type active layer in a range of 3.5 to 6 µm and setting the thickness of the second-conductivity type semiconductor layer to 1 µm or less. Further, a lowering in the specific sensitivity and degradation of the offset voltage adjusting function can be prevented by setting the difference between the thickness of the first-conductivity type active layer and the thickness of the second-conductivity type semiconductor layer in a range of 2 to 5 µm and making an optimum element structure.

Further, a sixth lateral Hall element according to this invention comprises a first-conductivity type substrate; a first-conductivity type active layer formed on the first-conductivity type substrate; a pair of first first-conductivity type semiconductor layers of high impurity concentration selectively formed with a preset distance apart from each other on the surface of the first-conductivity type active layer; current supply electrodes respectively formed on the pair of first first-conductivity type semiconductor layers; a pair of second first-conductivity type semiconductor layers of high impurity concentration formed with a preset distance apart from each other on the surface of the first-conductivity type active layer in position different from the first first-conductivity type semiconductor layers; sensor electrodes respectively formed on the pair of second first-conductivity type semiconductor layers; a first second-conductivity type semiconductor layer formed between the first-conductivity type active layer and the first-conductivity type substrate; and a second second-conductivity type semiconductor layer formed from the surface of the first-conductivity type active layer to a depth to reach the first second-conductivity type semiconductor layer to surround the first and second first-conductivity type semiconductor layers; wherein the thickness of the first second-conductivity type semiconductor layer is set in a range of 1.5 to 3 μm.

The semiconductor layer having the same conductivity type as the substrate and formed in contact with the first-conductivity type active layer can be omitted in the fourth lateral Hall element by using the first-conductivity type substrate. Further, the same effect as that of the fourth lateral Hall element according to this invention can be attained.

A seventh lateral Hall element according to this invention has a gate insulation film formed on a portion of the first-conductivity type active layer which is surrounded by an element isolation layer in the third lateral Hall element according to this invention; and a plurality of gate electrodes formed on the gate insulation film in position different from the current supply electrodes and the sensor electrodes.

Thus, the same effect as that of the fifth lateral Hall element according to this invention can be attained by forming one or more MOS structures on the surface of the first-conductivity type active layer in the third lateral Hall element according to this invention and applying a potential to the gate terminal of the MOS structure.

An eighth lateral Hall device according to this invention has four lateral Hall elements which are each constructed by the fifth or seventh lateral Hall element according to this invention, the lateral Hall elements are arranged with an inclination angle of 90 degrees with each other, corresponding ones of the current supply electrodes of the lateral Hall elements are connected in parallel in the orthogonal fashion, corresponding ones of the sensor electrodes of the lateral Hall elements are connected in parallel in the orthogonal fashion, and the gate electrodes of the lateral Hall elements are connected to each other in a desired manner.

The degree and width of a variation of the offset voltage adjustment can be selected and further adequate offset compensation can be attained by connecting one pair of current supply electrodes and one pair of sensor electrodes of each of the fifth or seventh lateral Hall elements in parallel in the orthogonal fashion, selectively connecting the second-conductivity type semiconductor layers or the gate electrodes to each other, and applying preset potentials thereto.

A ninth lateral Hall element according to this invention is a lateral Hall element which is constructed by the fifth or seventh lateral Hall element, and the lateral Hall element is used as a power detection element by passing a current proportional to a voltage of a to-be-measured system between the pair of current supply electrodes, applying the magnetic field proportional to a current in the to-be-measured system, and outputting a Hall voltage proportional to the product of the voltage and current in the to-be-measured system between the pair of sensor electrodes.

The electric power of the to-be-measured system can be measured with high precision by using the fifth or seventh lateral Hall element as a power detection element by utilizing the multiplication function of the voltage and current thereof.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 is a diagram indicating a deviation of the Hall voltage $V_h$ from the linearity in relation to an input voltage in the conventional lateral Hall element;

FIG. 5 is a schematic diagram indicating the wiring for the electrodes in the lateral Hall element of the above embodiment;

FIG. 6A is a characteristic diagram of the lateral Hall element of the above embodiment when $V_{IN}=0$;

FIG. 6B is a characteristic diagram of the lateral Hall element of the above embodiment when $V_{IN}>0$;

FIG. 6C is a characteristic diagram of the lateral Hall element of the above embodiment when $V_{IN}<0$;

FIG. 7 is a top plan view of a lateral Hall element according to a second embodiment of this invention;

FIG. 9 is a cross sectional view of a lateral Hall element according to a fourth embodiment of this invention;

FIG. 10A is a top plan view of a lateral Hall element according to a fifth embodiment of this invention;

FIG. 10B is a cross sectional view of the lateral Hall element taken along the line 10B—10B of FIG. 10A;

FIG. 13A is a top plan view showing a modification of the lateral Hall element of the above embodiment;

FIG. 13B is a cross sectional view of the lateral Hall element taken along the line 13B—13B of FIG. 13A;

FIG. 16A is a top plan view showing a modification of the lateral Hall element according to the above embodiment;

FIG. 16B is a cross sectional view of the lateral Hall element taken along the line 16B—16B of FIG. 16A;

FIG. 17A is a top plan view of a lateral Hall element according to an eighth embodiment of this invention;

FIG. 17B is a cross sectional view of the lateral Hall element taken along the line 17B—17B of FIG. 17A;

FIG. 18A is a top plan view of a lateral Hall element according to a ninth embodiment of this invention;

FIG. 23A is a top plan view of a lateral Hall element according to a tenth embodiment of this invention;

FIG. 23B is a cross sectional view of the lateral Hall element taken along the line 23B—23B of FIG. 23A;

DETAILED DESCRIPTION OF THE PREFERRED EMBODIMENTS

There will now be described embodiments of this invention with reference to the accompanying drawings.

(First Embodiment)

Figure 4A:
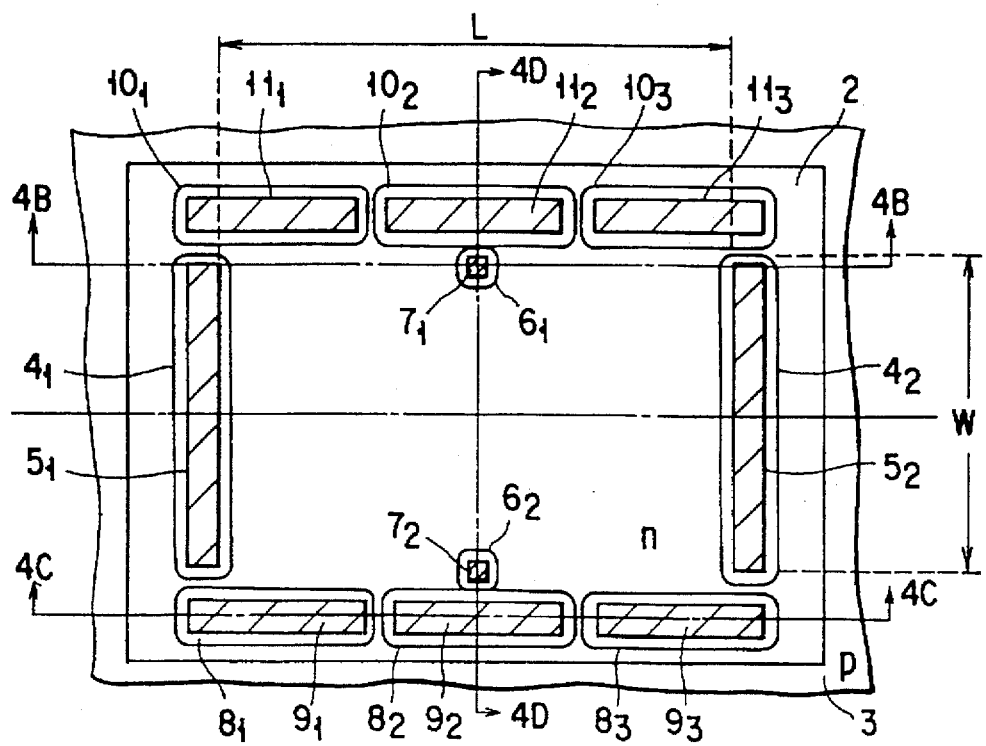
FIG. 4A is a top plan view of a lateral Hall element according to a first embodiment of this invention.
Figure 4B:
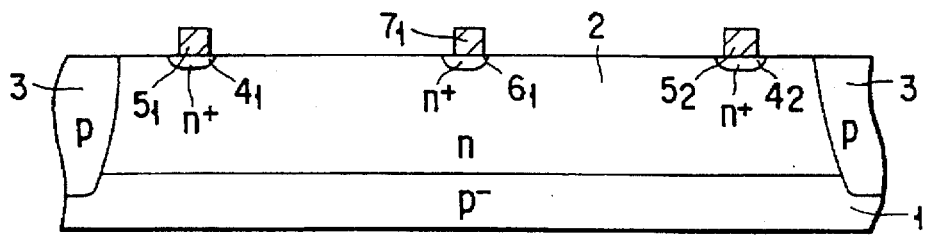
FIG. 4B is a cross sectional view of the lateral Hall element taken along the line 4B—4B of FIG. 4A.
Figure 4C:
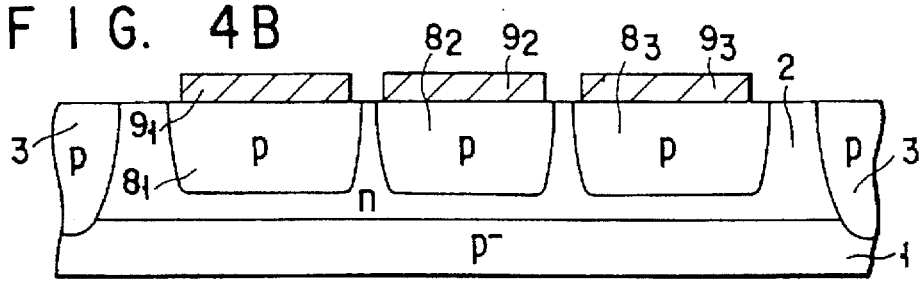
FIG. 4C is a cross sectional view of the lateral Hall element taken along the line 4C—4C of FIG. 4A.
Figure 4D:
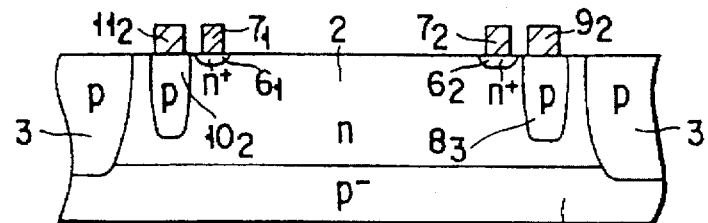
FIG. 4D is a cross sectional view of the lateral Hall element taken along the line 4D—4D of FIG. 4A.

FIG. 4A is a top plan view of a lateral Hall element according to a first embodiment of this invention, and FIG. 4B is a cross sectional view of the lateral Hall element taken along the line 4B—4B of FIG. 4A. FIG. 4C is a cross sectional view of the lateral Hall element taken along the line 4C—4C of FIG. 4A, and FIG. 4D is a cross sectional view of the lateral Hall element taken along the line 4D—4D of FIG. 4A. In FIGS. 4A to 4D, an n-type active layer 2 is formed on a $p^-$-type silicon substrate 1. The active layer 2 is surrounded by a p-type layer 3 which is formed to such a depth as to reach the substrate 1 and thus the active layer is isolated from the other region. Further, a pair of $n^+$-type layers $4_1, 4_2$ are formed to face each other on the surface of the active layer 2. A current supply electrode $5_1$ is formed on the $n^+$-type layer $4_1$, and a current supply electrode $5_2$ is formed on the $n^+$-type layer $4_2$. A pair of $n^+$-type layers $6_1, 6_2$ are formed to face each other on the surface of the active layer 2 in position different from the $n^+$-type layers $4_1, 4_2$, a sensor electrode $7_1$ is formed on the $n^+$-type layer $6_1$, and a sensor electrode $7_2$ is formed on the $n^+$-type layer $6_2$.

Further, p-type layers $8_1, 8_2, 8_3$ are formed to such a depth as not to reach the substrate 1 and disposed in a row in position on the outer side with respect to the $n^+$-type layer $6_2$. An electrode $9_1$ is formed on the p-type layer $8_1$, an electrode $9_2$ is formed on the p-type layer $8_2$, and an electrode $9_3$ is formed on the p-type layer $8_3$. Likewise, p-type layers $10_1, 10_2, 10_3$ are formed in a row on the surface of the active layer 3 in position on the outer side with respect to the $n^+$-type layer $6_1$, and electrodes $11_1, 11_2, 11_3$ are formed on the respective p-type layers. The p-type layers $8_1$ to $8_3$ are arranged at adequate distances from the substrate 1 and the other p-type layers $8_1$ to $8_3$ so that the depletion layers extending from the p-type layers $8_1$ to $8_3$ will not be brought into contact with the substrate 1 or the other p-type layers $8_1$ to $8_3$.

The ratio L/W of the distance L between the current supply electrodes $5_1$ and $5_2$ to the width W of the current supply electrode 5 is set to approx. 1 in order to make the Hall sensitivity maximum. Specifically, the width W and the distance L are approx. 120 μm and may be preferably set to approx. 10 to 1000 μm. The reason is that an alignment error in the manufacturing process becomes large and a deviation amount of the offset voltage becomes large if the width W and the distance L are 10 μm or less. Further, if the width W and the distance L are larger than 1000 μm, the resistance of the element becomes smaller to increase the loss and the chip area becomes large. The dimensions of the width W and the distance L of the current supply electrodes $5_1, 5_2$ are commonly used in each of the second and-succeeding embodiments.

An example of the wiring between the electrodes of the lateral Hall element shown in FIGS. 4A to 4D is diagrammatically shown in FIG. 5. The current supply electrode $5_1$, the electrodes $9_1, 9_2, 9_3$, and the current supply electrode $5_2$ are connected to each other via resistors $12_1, 12_2, 12_3, 12_4$ of high resistance. Likewise, the current supply electrode $5_1$, the electrodes $11_1, 11_2, 11_3$, and the current supply electrode $5_2$ are connected to each other via resistors $13_1, 13_2, 13_3, 13_4$ of high resistance. Further, a variable power supply $14_1$ is connected between the current supply electrode $5_2$ and the electrode $9_3$, and a variable power supply $14_2$ is connected between the current supply electrode $5_2$ and the electrode $11_3$. Further, a variable power supply 15 for supplying $V_{in}$ is connected between the current supply electrodes $5_1$ and $5_2$. A Hall voltage $V_h$ is detected by a voltmeter 16 connected between the sensor electrodes $7_1$, $7_2$.

FIGS. 6A to 6C are characteristic diagrams respectively showing the potential distribution $\Psi_{4B}$ on the cross section taken along the line 4B—4B of FIG. 4A, the potential distribution $\Psi_{4C}$ on the cross section taken along the line 4C—4C of FIG. 4A and the width $W_j$ of the depletion layer in the pn junction portion between the active layer 2 and the p-type layer 3 when a voltage $V_{in}$ is applied between the current supply electrodes $5_1$ and $5_2$ of the above lateral Hall element. FIG. 6A shows a case wherein $V_{in}=0$, FIG. 6B shows a case wherein $V_{in}>0$, and FIG. 6C shows a case wherein $V_{in}<0$.

Figure 1A:
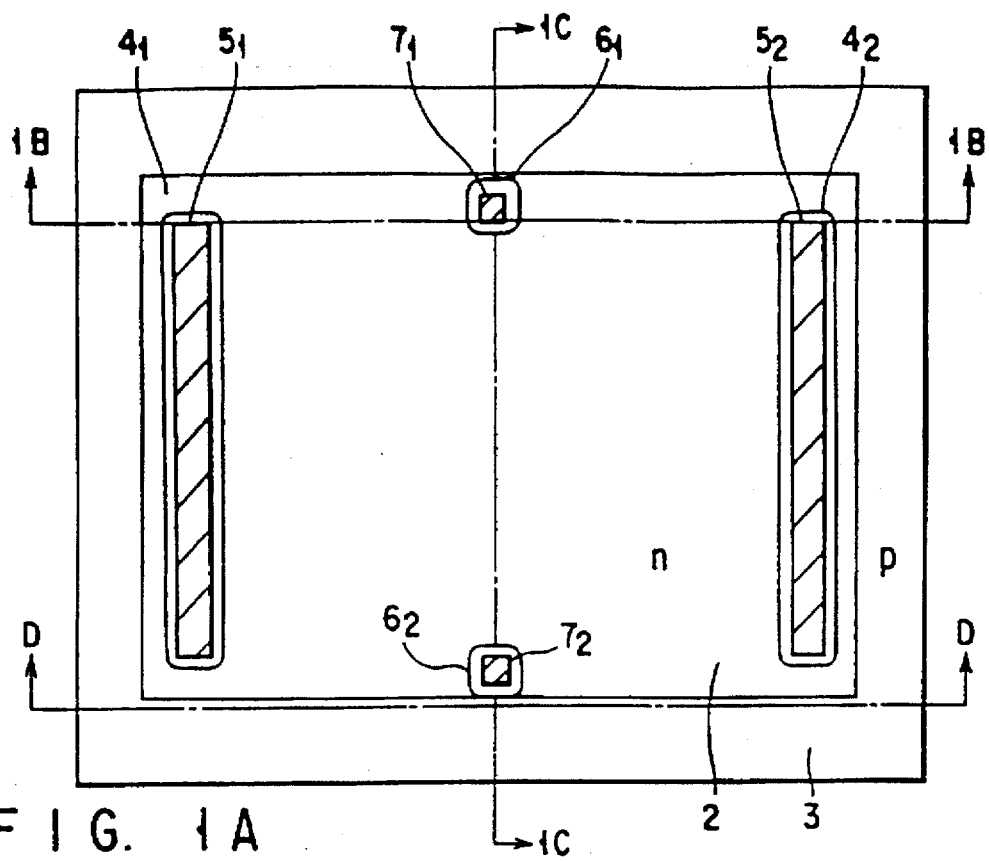
FIG. 1A is a top plan view of a conventional lateral Hall element.
Figure 1B:
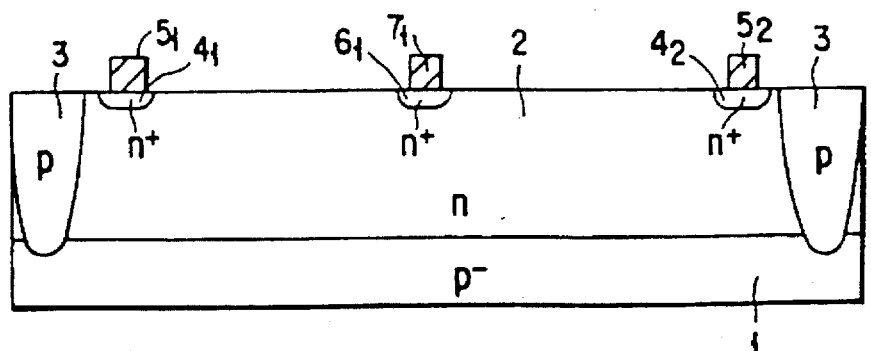
FIG. 1B is a cross sectional view of the lateral Hall element taken along the line 1B—1B of FIG. 1A.
Figure 1C:
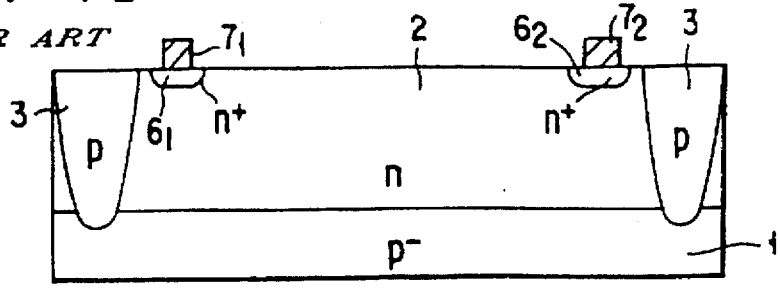
FIG. 1C is a cross sectional view of the lateral Hall element taken along the line 1C—1C of FIG. 1A.
Figure 2A:
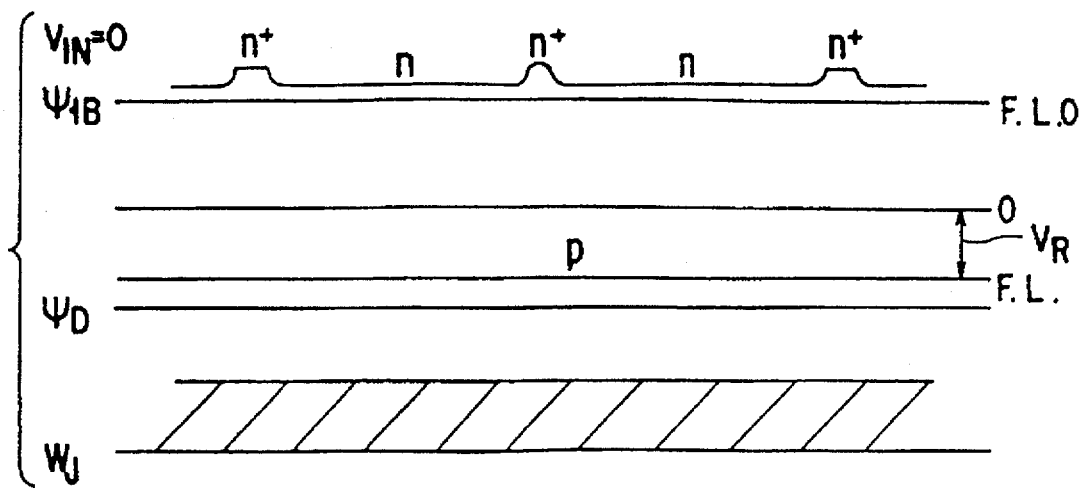
FIG. 2A is a characteristic diagram of the lateral Hall element of FIG. 1A when $V_{IN}=0$.
Figure 2B:
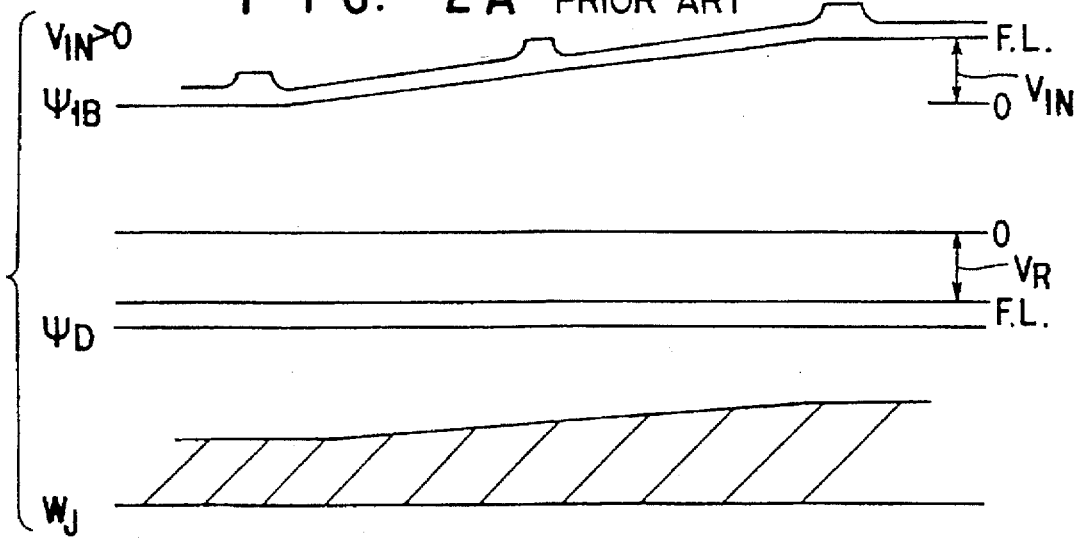
FIG. 2B is a characteristic diagram of the lateral Hall element of FIG. 1A when $V_{IN}>0$.
Figure 2C:
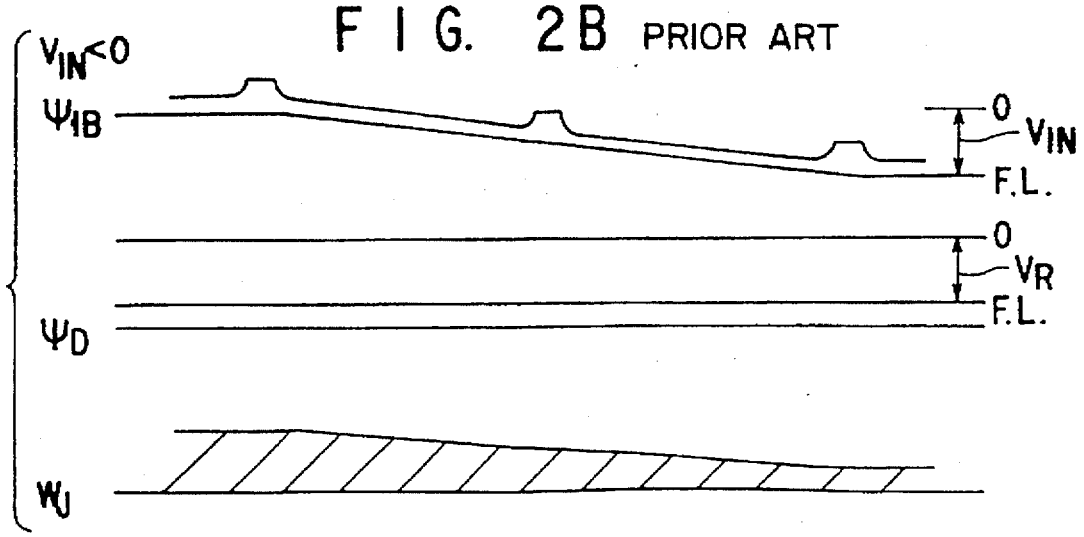
FIG. 2C is a characteristic diagram of the lateral Hall element of FIG. 1A when $V_{IN}<0$.

In the case of $V_{in}=0$, $\Psi_{4B}$ becomes the same as $\Psi_{1B}$ shown in FIG. 2A, but in $\Psi_{4C}$, the potential of the n-type layer 2 becomes higher than the potential 0 and the potentials of the p-type layers $8_1$ to $8_3$ becomes lower than the potential 0. The depletion layers take shapes corresponding to the p-type layers $8_1$ to $8_3$.

In the case of $V_{in}>0$, in both of $\Psi_{4B}$ and $\Psi_{4C}$, the F.L. on the current supply electrode $5_2$ side becomes higher than the potential 0 by $V_{in}$. At this time, the potentials of the p-type layers $8_1$ to $8_3$ rise in proportion to $V_{in}$. As a result, the width $W_j$ of the depletion layer is widened on the current supply electrode $5_2$ side but is narrowed on the current supply electrode $5_1$ side. Therefore, in this case, only the shape of the depletion layer in the case of $V_{in}=0$ varies, and the depletion layer is not substantially widened as a whole. An increase thereof is at most 2% for an application voltage of +2 V.

In the case of $V_{in}<0$, the relation between the current supply electrode lying on the potential rising side and the other current supply electrode is reversed in comparison with the case of $V_{in}>0$, and in this case, the depletion layer is not substantially widened as a whole.

Therefore, the extension of the entire depletion layer along the cross sections taken along the lines 4B—4B and 4C—4C becomes substantially independent from $V_{in}$. As a result, the resistance of the element is kept substantially unchanged and the linearity of the Hall sensitivity can be maintained. Further, in the above lateral Hall element, since potential differences can be applied between the electrodes $9_1$, $9_2$, $9_3$ and the electrodes $11_1$, $11_2$, $11_3$ by use of the power supplies $14_1$ and $14_2$, different values of $W_j$ can be set on the side of the electrodes $9_1$ to $9_3$ and on the side of the electrodes $11_1$ to $11_3$. Thus, an unbalanced voltage occurring between the sensor electrodes $7_1$ and $7_2$ can be canceled.

(Second Embodiment)

FIG. 7 is a top plan view of a lateral Hall element according to a second embodiment of this invention. In FIG. 7, portions which are the same as those of FIGS. 4A to 4D are denoted by the same reference numerals and this is applied to the following drawings. The lateral Hall element is different from the lateral Hall element of FIGS. 4A to 4D in that eight p-type layers $8_1$ to $8_4$, $10_1$ to $10_4$ are formed and eight electrodes $9_1$ to $9_4$, $11_1$ to $11_4$ are respectively formed on them. Still another different point is that the p-type layers $8_1$ to $8_4$, $10_1$ to $10_4$ and the electrodes $9_1$ to $9_4$, $11_1$ to $11_4$ are not formed on the outer side of the sensor electrodes $7_1$, $7_2$, but are formed in substantially the same row as the sensor electrodes $7_1$, $7_2$ between two current supply electrodes $5_1$ and $5_2$, the electrodes $9_2$, $9_3$ and the electrodes $11_2$, $11_3$ are disposed to respectively surround half portions of the sensor electrodes $7_2$ and $7_1$.

In the lateral Hall element, since the sensitivity is lowered if $n^+$-type layers $6_1$, $6_2$ are disposed in the current path, the sensitivity can be enhanced by using the structure shown in FIG. 7.

(Third Embodiment)

Figure 8A:
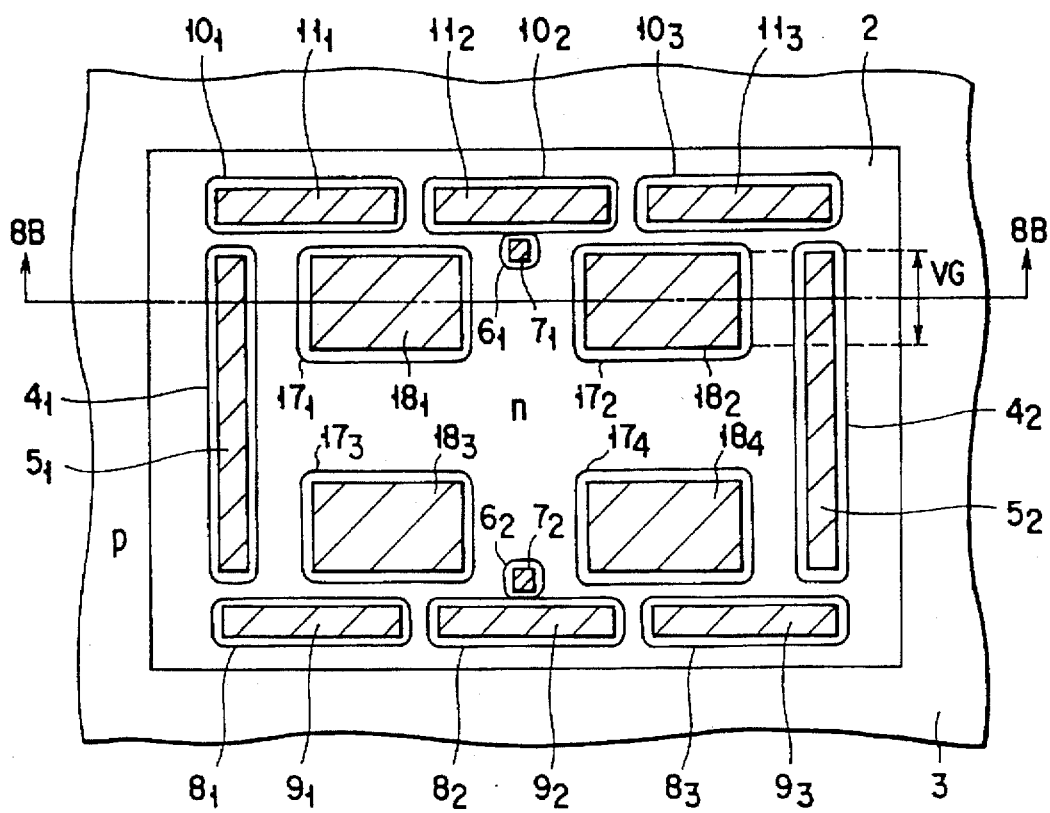
FIG. 8A is a top plan view of a lateral Hall element according to a third embodiment of this invention.
Figure 8B:
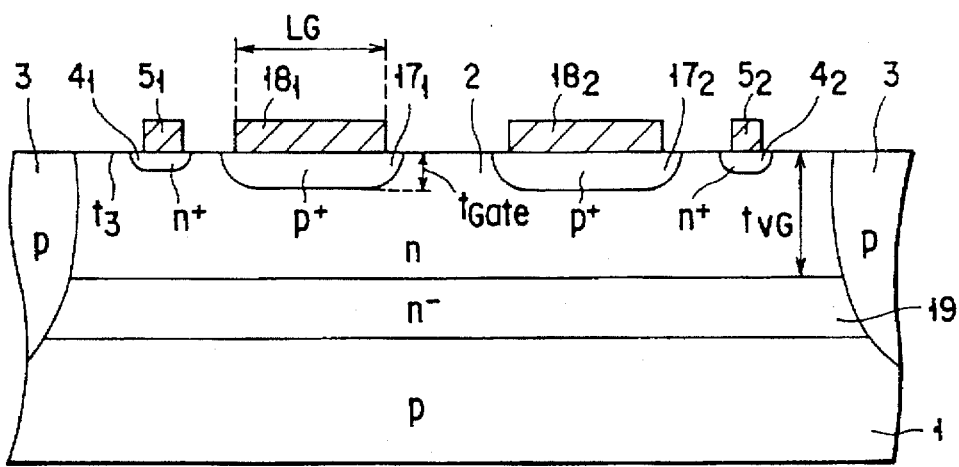
FIG. 8B is a cross sectional view of the lateral Hall element taken along the line 8B—8B of FIG. 8A.

FIG. 8A is a top plan view of a lateral Hall element according to a third embodiment of this invention, and FIG. 8B is a cross sectional view of the lateral Hall element taken along the line 8B—8B of FIG. 8A. The lateral Hall element is different from the lateral Hall element of FIGS. 4A to 4D in that four p-type layers $17_1$, $17_2$, $17_3$, $17_4$ are formed in an area surrounded by the current supply electrodes 5 and the electrodes 9, 11 and electrodes $18_1$, $18_2$, $18_3$, $18_4$ are respectively formed on the p-type layers $17_1$, $17_2$, $17_3$, $17_4$. Still another different point is that an $n^-$-type layer 19 is formed between the substrate 1 and the active layer 2. Since an influence by the depletion layer extending from the substrate 1 is exerted only on the $n^-$-type layer 19 and is not exerted on the active layer 2 due to the presence of the $n^-$-type layer 19, the sensitivity of measurement can be made constant.

In the above lateral Hall element, the extension of the depletion layer in a direction perpendicular to the cross section taken along the line 8B—8B can be suppressed by setting the potentials of the current supply electrode $5_1$, electrodes $18_1$, $18_3$, electrodes $18_2$, $18_4$, and current supply electrode $5_2$ to fixed values which become larger or smaller in this order.

The p-type layers $17_1$ to $17_4$ are formed by diffusing impurity from the upper surface of the element, but when the diffusion depth $t_{Gate}$ comes near the thickness $t_{VG}$ of the active layer 2, the sensitivity is lowered. Therefore, it is preferable to set $t_{Gate}$ as small as possible and it may be set to 1 µm or less, for example.

Further, if the area of the p-type layers $17_1$ to $17_4$ is large, the resistance of the element is made larger and the sensitivity thereof is lowered, and therefore, it is preferable to set the length $L_G$ and the width $W_G$ of the electrodes $18_1$ to $18_4$ on the p-type layers $17_1$ to $17_4$ as small as possible in a range that formation of the electrodes $18_1$ to $18_4$ is effective. Specifically, the length $L_G$ is set to approx. 30 µm, and preferably 50 µm or less and the width $W_G$ is set to approx. 30 µm, and preferably 50 µm or less.

Further, if the thickness $t_{VG}$ of the active layer 2 is set to a value excessively larger than the diffusion depth of the $n^+$-type layers $4_1 4_2$, $6_1$, $6_2$, a current component in the longitudinal direction which does not contribute to the Hall voltage $V_h$ is generated and the sensitivity is lowered, and therefore, it is preferably set to 3.5 to 6 µm. The fact that "it is preferable to set the diffusion depth $t_{Gate}$ as small as possible, for example, to 1 µm or less, and it is preferable to set the thickness $t_{VG}$ of the active layer 2 to approx. 3.5 to 6 µm" is not limited to this embodiment and can be commonly applied to the other embodiments.

(Fourth Embodiment)

FIG. 9 is a cross sectional view of a lateral Hall element according to a fourth embodiment of this invention and corresponding to the cross sectional view taken along the line 8B—8B of FIG. 8A. The lateral Hall element is different from the lateral Hall element of FIG. 8B in that a silicon oxide film 20 is formed between the substrate 1 and the active layer 2 instead of the $n^-$type layer 19 of FIG. 8B as shown in FIG. 9. Since the active layer 2 can be electrically isolated from the substrate 1 due to the presence of the silicon oxide layer 20, an influence by the depletion layer extending from the substrate 1 on the active layer 2 can be almost completely eliminated.

(Fifth Embodiment)

FIG. 10A is a top plan view of a lateral Hall element according to a fifth embodiment of this invention, and FIG. 10B is a cross sectional view of the lateral Hall element taken along the line 10B—10B of FIG. 10A. The lateral Hall element has a substrate 1 (p type; resistivity: 2 to 6 Ω.cm; thickness: approx. 625 μm), an active layer 2 (n type; resistivity: 1.5 to 2.5 Ω.cm; thickness: approx. 5 μm) having a conductivity type opposite to that of the substrate 1 and formed on the substrate 1, and a semiconductor layer 19 (n type; resistivity: 0.001 Ω.cm or less) having the same conductivity type as that of the active layer 2 and a resistance lower than that of the active layer 2 and selectively or entirely formed between the substrate 1 and the active layer 2.

With the above structure, when a bias voltage is applied between the substrate 1 and the active layer 2, depletion layers extend on the substrate 1 side and the active layer 2 side, but extension of the depletion layer on the active layer 2 can be suppressed since the semiconductor layer 19 has a low resistance and a high impurity concentration of $10^{20}$ cm$^{-3}$ or less. Further, the linearity of various Hall characteristics such as the specific sensitivity, offset voltage, input resistance with respect to the input voltage can be improved and a variation in the Hall characteristic with respect to the polarity of the voltage applied to the pair of current supply electrodes $5_1$, $5_2$ and the magnitudes thereof caused by an influence by the bias voltage applied between the substrate 1 and the active layer 2 can be suppressed.

It is preferable to set the thickness of the semiconductor layer 19 to 0.5 to 3 μwhen taking it into consideration that it will suppress the extension of the depletion layer and suppress the side diffusion length at the time of formation. Further, a two-layered structure of SiO$_2$ films 41 42 is formed on the active layer 2 and p-type layer 3, and it is preferable to set the thickness of the upper layer or SiO$_2$ film 41 to 3000 to 5000 μm and set the thickness of the lower layer or SiO$_2$ film 42 to approx. 500 μm.

(Sixth Embodiment)

Figure 11A:
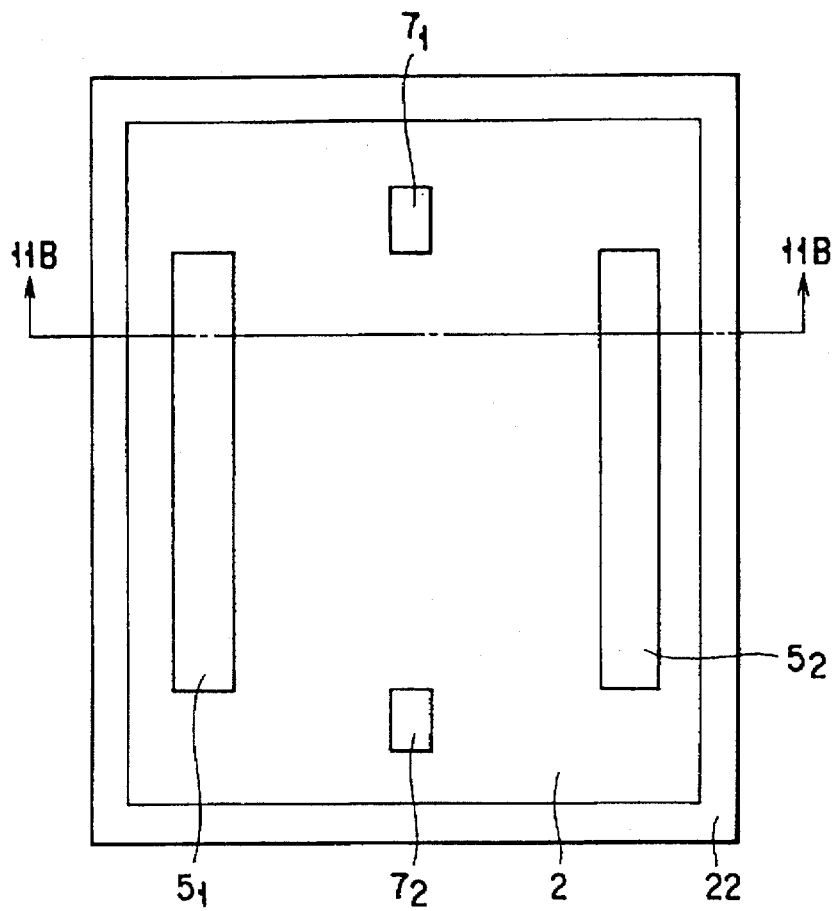
FIG. 11A is a top plan view of a lateral Hall element according to a sixth embodiment of this invention.
Figure 11B:
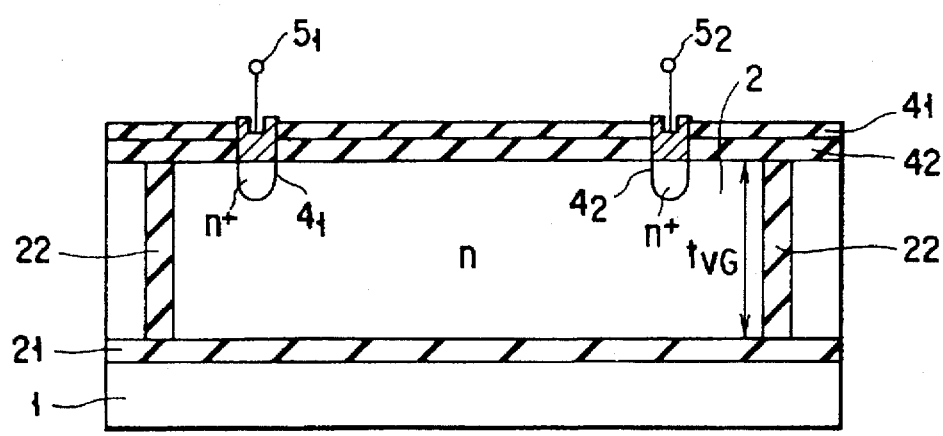
FIG. 11B is a cross sectional view of the lateral Hall element taken along the line 11B—11B of FIG. 11A.
Figure 12:
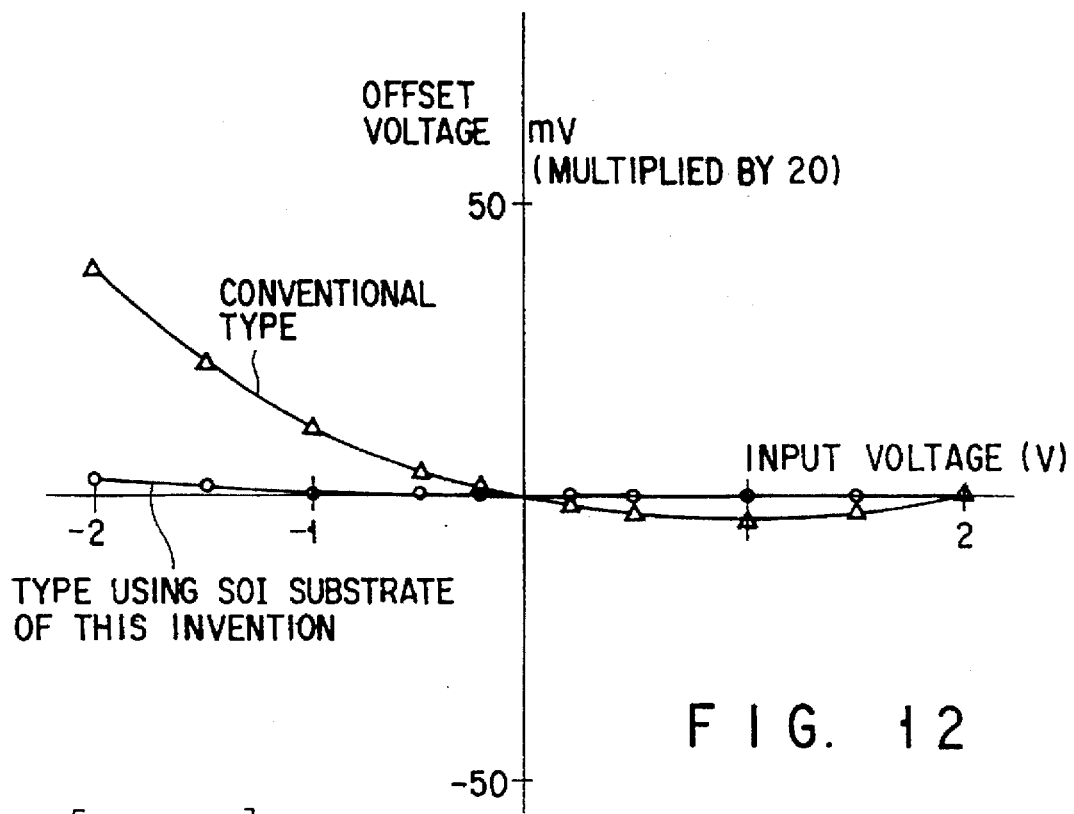
FIG. 12 is a diagram indicating the relation between the input voltage and offset voltage of the lateral Hall element according to the above embodiment together with a comparison example.

FIG. 11A is a top plan view of a lateral Hall element according to a sixth embodiment of this invention, and FIG. 11B is a cross sectional view of the lateral Hall element taken along the line 11B—11B of FIG. 11A. The lateral Hall element has an SOI substrate formed of a substrate 1 (p type; resistivity: 2 to 6 Ω.cm), an active layer 2 (n type; resistivity: 1.5 to 2.5 Ω.cm) and an insulating layer 21 (SiO$_2$) formed between the substrate 1 and the active layer 2. An element isolation layer 22 (width: 1 μm) can be formed of a pn junction isolation layer (p-type surface concentration: $10^{18}$ cm$^{-3}$ or less) or dielectric isolation layer by trench element isolation. The depletion layer does not extend into the active layer 2 at all due to the presence of the insulating layer 21 and a variation in the various Hall characteristics caused by the potential difference between the substrate 1 and the active layer 2 can be prevented. Further, when the element isolation layer 22 is formed by dielectric isolation, an influence of the depletion layer extending into the active layer 2 from the side surface can be prevented. It is preferable to set the thickness of the insulating layer 21 to 0.3 to 2 μm from the viewpoint of suppression of the operation of the parasitic transistor and prevention of warping of the SOI wafer. Further, when the element isolation layer is formed of a p-type layer 3 and formed by pn junction isolation as shown in FIG. 13B in the lateral Hall element shown in FIG. 13A, a guard ring layer 23 (p type) having a diffusion depth larger than the n$^+$-type layers $4_1$, $4_2$, $6_1$, $6_2$ (depth: approx. 0.5 μm) for the current supply electrodes $5_1$, $5_2$ and sensor electrodes $7_1$, $7_2$ may be formed to surround the current supply electrodes $5_1$, $5_2$ and sensor electrodes $7_1$, $7_2$ in order to suppress the influence by extension of the depletion layer from the side surface as described before. It is necessary to set the thickness of the guard ring layer 23 larger than half the depth of the active layer 2 in such a range that the guard ring layer will not reach the insulating layer 21. FIG. 12 is a diagram indicating the dependency of the offset voltage $V_{off}$ on the input voltage $V_{in}$ when the SOI substrate of the above embodiment is used. A variation in $V_{off}$ with a variation in $V_{in}$ is extremely small in comparison with the case of the conventional structure and is suppressed to 1 mV or less.

Figure 14:
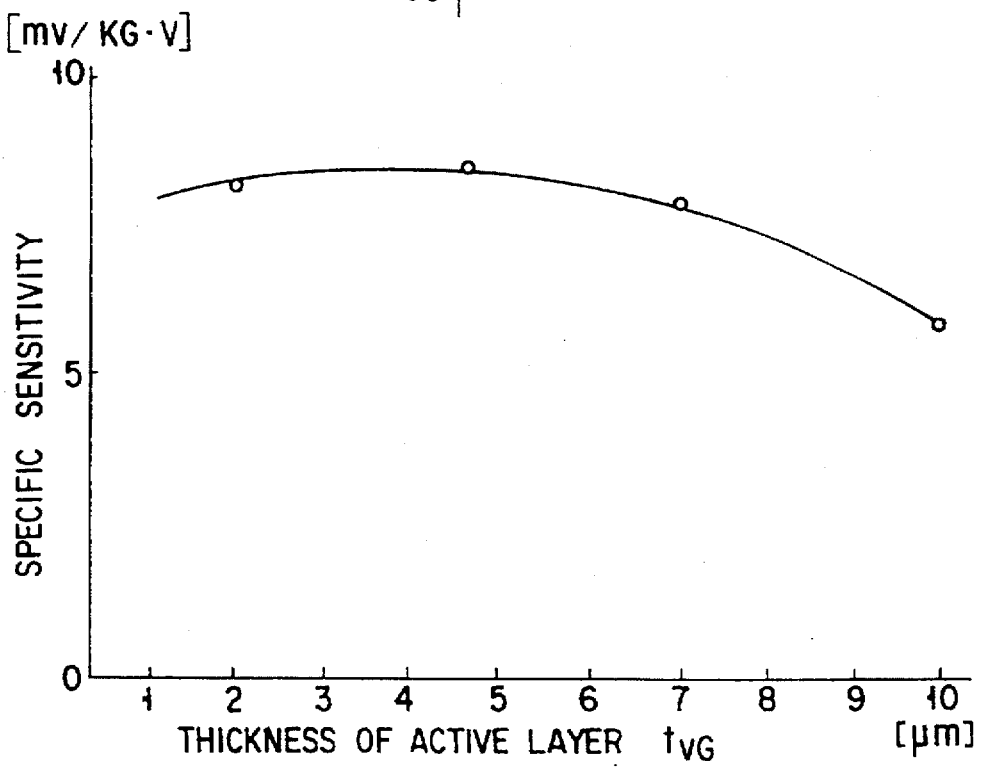
FIG. 14 is a diagram indicating a variation in the specific sensitivity with respect to the thickness of the active layer of the lateral Hall element according to the above embodiment.

A variation in the specific sensitivity with respect to the thickness $t_{VG}$ of the active layer 2 is shown in FIG. 14. It is understood from FIG. 14 that the maximum specific sensitivity can be attained when the thickness $t_{VG}$ of the active layer 2 is approx. 4 μm. On the other hand, if the specific sensitivity is excessively low, noise cannot be distinguished and the resolution is lowered. Therefore, it is preferable to set the specific sensitivity to 6.5 mV/KG.V, and in this case, the thickness $t_{VG}$ of the active layer 2 is 9 μm or less. However, if the thickness $t_{VG}$ is excessively small, the surface scattering of carriers occurs in the interface between the active layer 2 and the insulating layer 21 to lower the mobility, and it is preferable to set the thickness $t_{VG}$ to 0.5 μm or more.

(Seventh Embodiment)

Figure 15A:
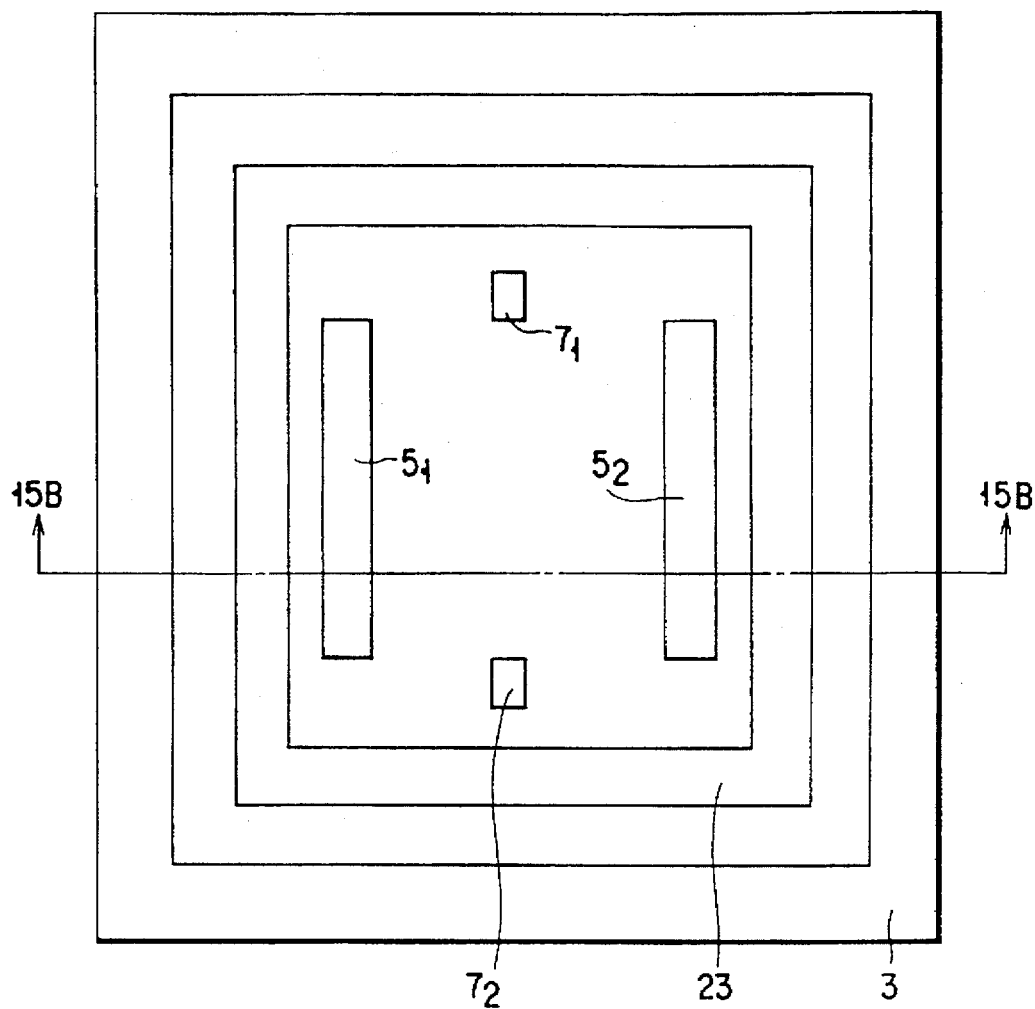
FIG. 15A is a top plan view of a lateral Hall element according to a seventh embodiment of this invention.
Figure 15B:
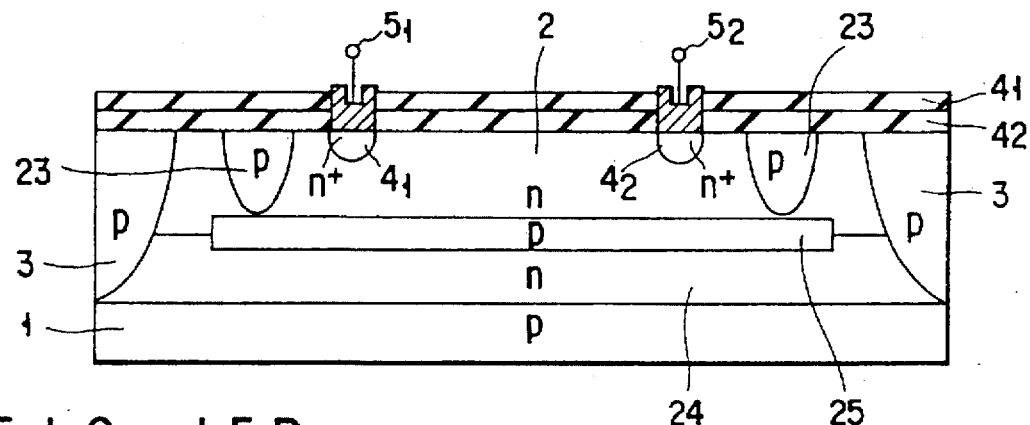
FIG. 15B is a cross sectional view of the lateral Hall element taken along the line 15B—15B of FIG. 15A.

FIG. 15A is a top plan view of a lateral Hall element according to a seventh embodiment of this invention, and FIG. 15B is a cross sectional view of the lateral Hall element taken along the line 15B—15B of FIG. 15A. The lateral Hall element has a substrate 1 (p type; resistivity: 2 to 6 Ω.cm), a semiconductor layer 24 (n type; resistivity: 1.5 to 2.5 Ω.cm; thickness: 1.5 to 5 μm) having a conductivity type opposite to that of the substrate 1 and formed by epitaxial growth on the substrate 1, a semiconductor layer 25 (p type; resistivity: 0.05 to 0.1 Ω.cm; thickness: 0.5 to 3 μm) having the same conductivity type as that of the substrate 1 and selectively formed on the surface of the semiconductor layer 25, and an active layer 2 (n type; resistivity: 1.5 to 2.5 Ω.cm; thickness: approx. 5 μm) having a conductivity type opposite to that of the substrate 1 and formed by epitaxial growth on the semiconductor layers 24, 25.

Further, a guard ring layer 23 (p type; surface concentration: $10^{18}$ cm$^{-3}$) having the same conductivity type as that of the substrate 1 is selectively formed from the surface of the active layer 2 to reach the semiconductor layer 25 so as to surround n$^+$-type layers $4_1$, $4_2$ (n type; resistivity: 0.001 Ω.cm) formed on the active layer 2 for a pair of current supply electrodes $5_1$, $5_2$ and n$^+$-type layers (n type; resistivity: 0.001 Ω.cm) for a pair of sensor electrodes $7_1$, $7_2$. With the above structure, variations in the various Hall characteristics caused by the influence of bias voltages applied between the substrate 1 and the active layer 2 and between the element isolation layer and the active layer 2 can be suppressed as described before. If the substrate 1 is n type in the seventh embodiment, the semiconductor layer 25 having the same conductivity type as that of the substrate 1 can be omitted as shown in FIGS. 16A, 16B. In this case, it is preferable that the semiconductor layer 24 is formed of p type, the resistivity thereof lies in a range of 1.5 to 2.5 μm, and the thickness thereof is set in a range of 1.5 to 3.0 μm.

(Eighth Embodiment)

FIG. 17A is a top plan view of a lateral Hall element according to an eighth embodiment of this invention, and FIG. 17B is a cross sectional view of the lateral Hall element taken along the line 17B—17B of FIG. 17A. This embodiment is so constructed that the resistance of the substrate 1 is made larger than that of the active layer 2 by two to four figures (the impurity concentration of the substrate is lowered and the resistivity thereof is set to 200 to 400 Ω.cm) so as to permit the depletion layer to extend towards the substrate 1 side, thereby suppressing extension of the depletion layer towards the active layer 2 side.

(Ninth Embodiment)

Figure 18B:
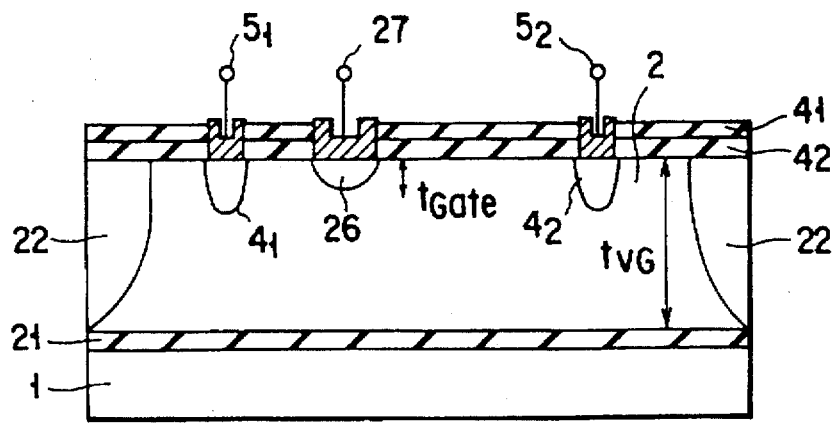
FIG. 18B is a cross sectional view of the lateral Hall element taken along the line 18B—18B of FIG. 18A.

FIG. 18A is a top plan view of a lateral Hall element according to a ninth embodiment of this invention, and FIG. 18B is a cross sectional view of the lateral Hall element taken along the line 18B—18B of FIG. 18A. The element of this embodiment is so constructed that the offset voltage can be adjusted from the exterior. In an example of FIGS. 18A, 18B, the element of the sixth embodiment (FIGS. 11A, 11B) is used. That is, one or more diffusion layers 26 (surface concentration: $10^{18}$ cm$^{-3}$ or less; depth: 0.35 μm) having a conductivity type different from that of the active layer 2 are selectively formed from the surface of the active layer 2 in a portion of the active layer 2 which is disposed between a pair of current supply electrodes $5_1$, $5_2$ and a pair of sensor electrodes $7_1$, $7_2$ and gate (electrode) terminals 27 are formed on the diffusion layers in addition to the structure of FIGS. 11A, 11B.

With the above structure, when a voltage is applied to the gate terminal 27 from the exterior, the depletion layer extends into the active layer 2 to change the passage of a current flowing between the current supply electrodes $5_1$ and $5_2$, thus making it possible to adjust the offset voltage. In the lateral Hall element, it is necessary to correct a potential difference caused between a pair of sensor electrodes $7_1$, $7_2$ by the dissymmetry of the resistances between the terminals of an equivalent four-terminal bridge constructed by a pair of current supply electrodes $5_1$, $5_2$ and a pair of sensor electrodes $7_1$, $7_2$, and more specifically, it is necessary to arrange the gate terminals 27 in position deviated from the intersection (center of the active layer 2) of a line connecting the centers of the two current supply electrodes $5_1$, $5_2$ and a line connecting the centers of the two sensor electrodes $7_1$, $7_2$.

Figure 19:
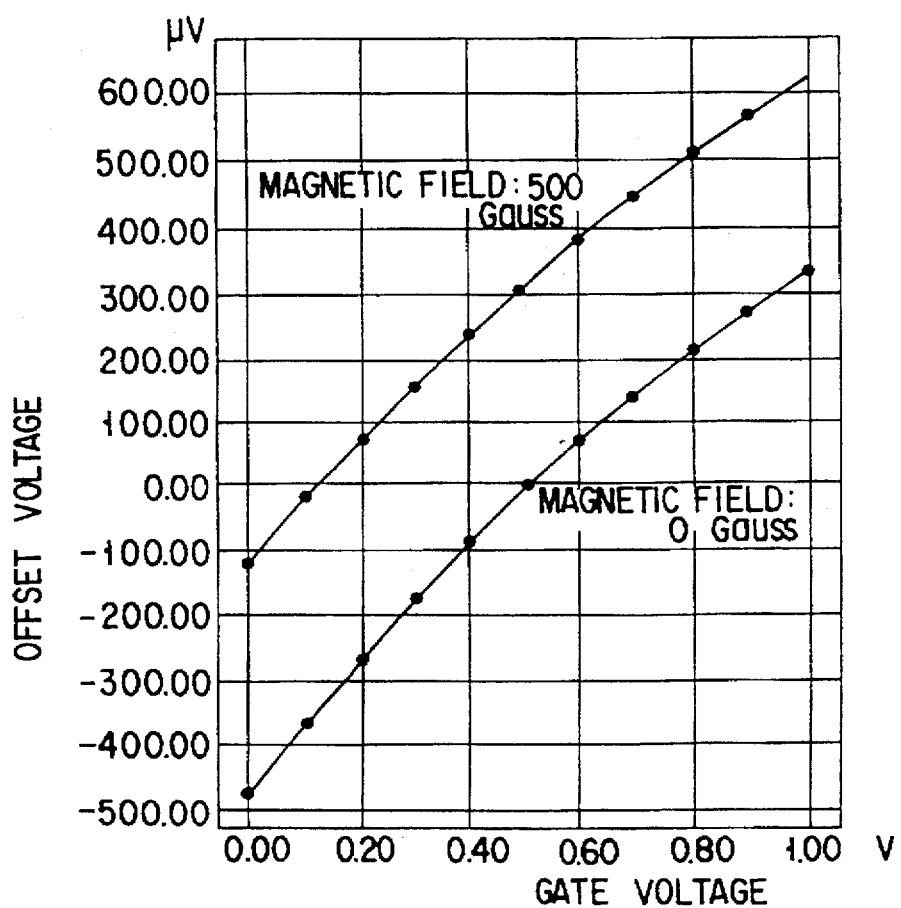
FIG. 19 is a diagram showing the result of experiments obtained by adjusting the offset voltage by changing the gate voltage in the lateral Hall element according to the above embodiment.

In this case, since the pattern of the lateral Hall element is not symmetrical, it becomes necessary to take a measure for suppressing the extension of the depletion layer towards the active layer 2 by a potential difference between the substrate 1 and the active layer 2 like the fifth to eighth embodiments. That is, even if a fixed potential is applied to the gate terminal 27, it cannot be effectively used by a variation of the depletion layer between the substrate 1 and the active layer 2. FIG. 19 shows the relation between the gate voltage applied to the gate terminal 27 and the adjusted offset voltage. The offset voltage can be easily changed by applying a potential to the gate terminal 27. According to the data, the offset voltage can be adjusted at the rate of 0.8 mV/V. The thickness ($t_{VG}$) of the active layer 2 and the depth ($t_{Gate}$) of the diffusion layer 26 may be set to optimum values in relation to the Hall characteristic. For example, a preferable range of ($t_{VG}$- $t_{Gate}$) is set to 3.5 to 6 μm since it is preferable to set the specific sensitivity to 6.5 or more. That is, if the thickness $t_{VG}$ of the active layer 2 is extremely larger than the depth $t_{Gate}$ of the diffusion layer 26, a current contributing to generation of the Hall voltage $V_h$ is reduced to lower the specific sensitivity and the function of adjusting the offset voltage by the gate voltage is considerably lowered.

Figure 20:
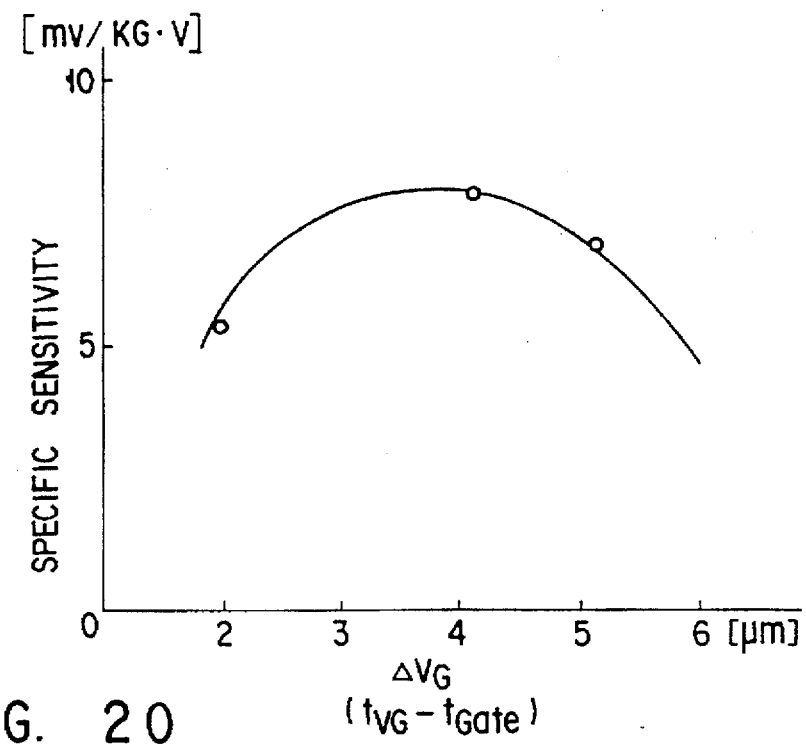
FIG. 20 is a diagram indicating the relation between the thickness of the active layer and the depth of the conductivity type diffusion layer with respect to a variation in the specific sensitivity in the lateral Hall element according to the above embodiment.

On the other hand, if the thickness $t_{VG}$ of the active layer 2 is extremely smaller than the depth $t_{Gate}$ of the diffusion layer 26, the passage of a Hall current is obstructed by the presence of the diffusion layer 26 so as to lower the specific sensitivity and increase the offset voltage. FIG. 20 is a diagram indicating a variation in the specific sensitivity with respect to a difference between the thickness of the active layer and the depth of the diffusion layer 26. According to FIG. 20, it is determined that the range of ($t_{VG}$- $t_{Gate}$) which gives the specific sensitivity of 5 or more is set to 2 to 5 μm. When the value of ($t_{VG}$- $t_{Gate}$) is 3.8 μm, the maximum specific sensitivity is obtained. In order to set the value of ($t_{VG}$- $t_{Gate}$) to 3.8 μm, it is preferable to set the $t_{VG}$ to 4.55 μm if $t_{Gate}$ is 0.75 μm, for example.

Figure 21:
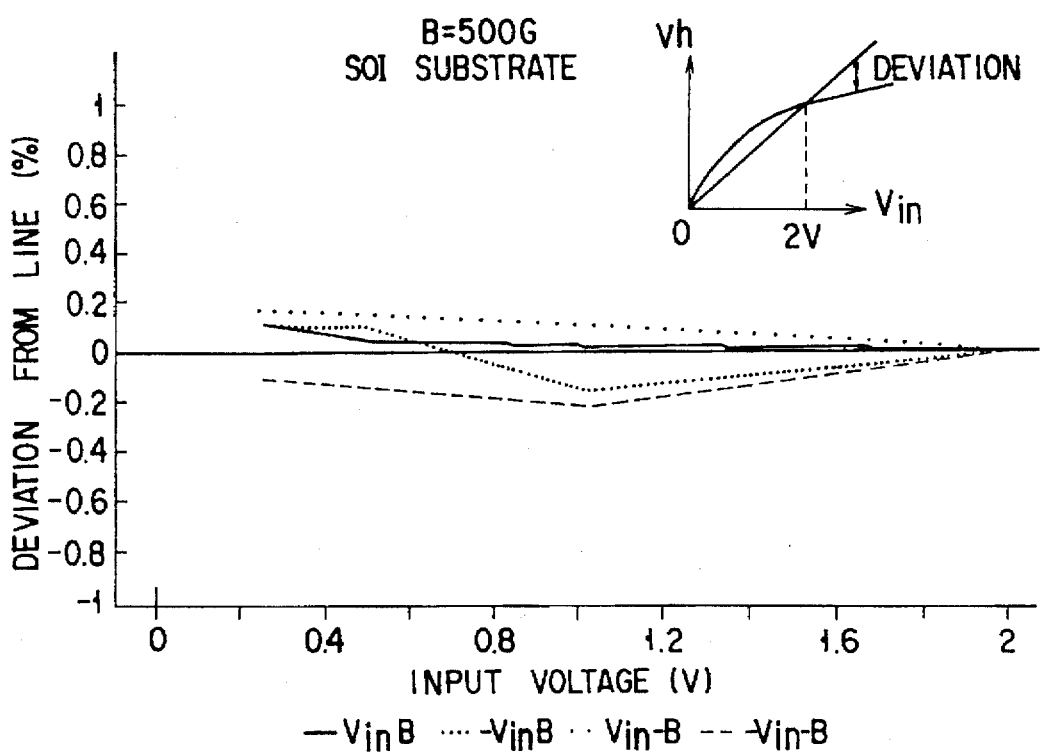
FIG. 21 is a diagram indicating a deviation of the Hall voltage $V_h$ from the linearity in relation to an input voltage in the lateral Hall element according to the modification of the above embodiment.

FIG. 21 is a diagram indicating an amount of deviation of the Hall voltage $V_h$ from a straight line used as a reference line and connecting a point of the Hall voltage $V_h$ obtained when the input voltage is 2 V to the origin in relation to the input voltage in the lateral Hall element shown in FIGS. 18A, 18B. As shown in FIG. 21, a deviation amount of the Hall voltage $V_h$ can be suppressed within 0.2% when the input voltage is in the range of 0 to 2 V.

Figure 22A:
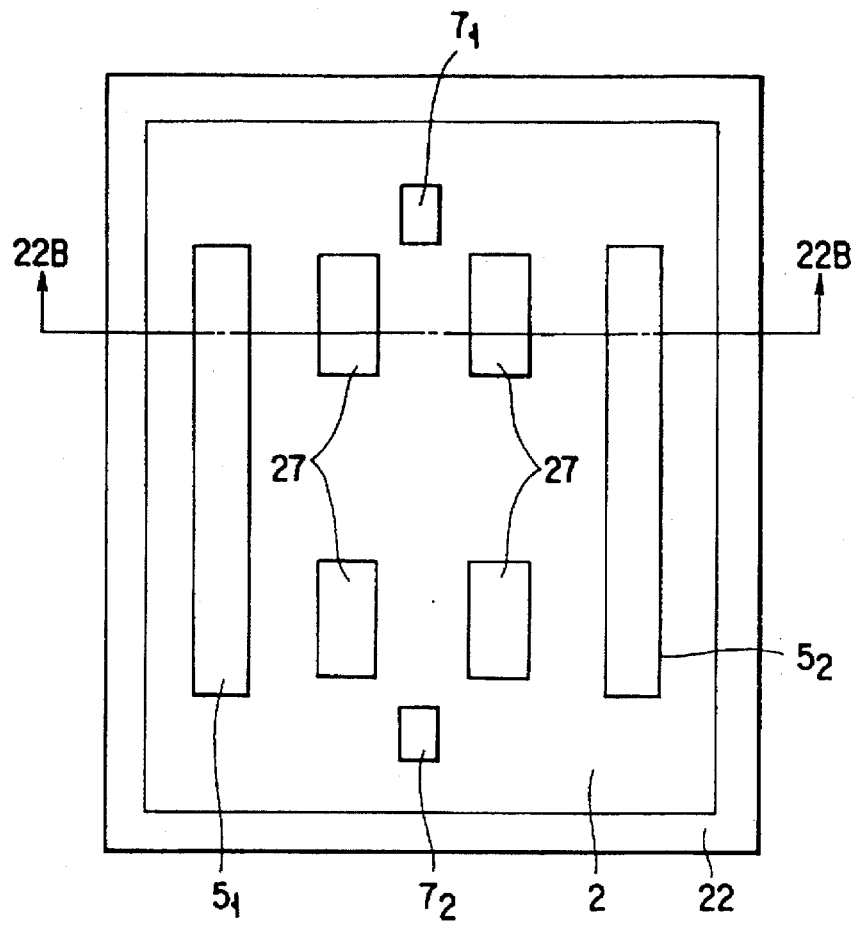
FIG. 22A is a top plan view showing a modification of the lateral Hall element according to the above embodiment.
Figure 22B:
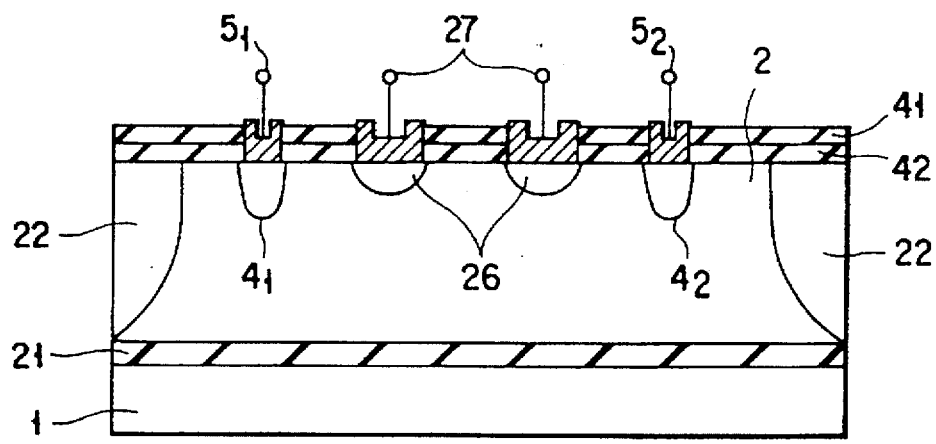
FIG. 22B is a cross sectional view of the lateral Hall element taken along the line 22B—22B of FIG. 22A.

FIGS. 22A, 22B show a modification of the ninth embodiment and indicate a lateral Hall element having four diffusion layers 26. Further, in the lateral Hall element, four gate terminals 27 are formed.

Unlike the lateral Hall element having the two gate terminals 27 shown in FIGS. 18A, 18B, in the lateral Hall element of this modification, a four-terminal bridge can be constructed and more stable and precise adjustment of the offset voltage can be attained.

(Tenth Embodiment)

FIG. 23A is a top plan view of a lateral Hall element according to a tenth embodiment of this invention, and FIG. 23B is a cross sectional view of the lateral Hall element taken along the line 23B—23B of FIG. 23A. The lateral Hall element of this embodiment utilizes a MOS structure instead of the gate of the pn junction structure in the ninth embodiment in the system for adjusting the offset voltage from the exterior. That is, in the lateral Hall element of this embodiment, the thickness of the active layer 2 is reduced to 1 μm or less, the isolation technique using a LOCOS oxide film 28 is used for formation of the element isolation region, and one or more MOS structures are formed in the surface region of the active layer 2 which is disposed between a pair of current supply electrodes $5_1$, $5_2$ and a pair of sensor electrodes $7_1$, $7_2$ to adjust the offset voltage from the exterior. In the MOS structure, a gate oxide film 29 with a film thickness of 10 nm and a gate electrode 30 of polysilicon gate are used. The active layer 2 is of n type, and the film thickness of a buried oxide film 31 is set to 0.5 μm. In this example, a negative potential is applied to the gate electrode 30 and a p channel is formed in the $SiO_2$/Si interface. Since the active layer 2 is thin, the current path can be easily changed and the offset voltage can be adjusted by applying a voltage to the gate electrode 30.

(Eleventh Embodiment)

Figure 24:
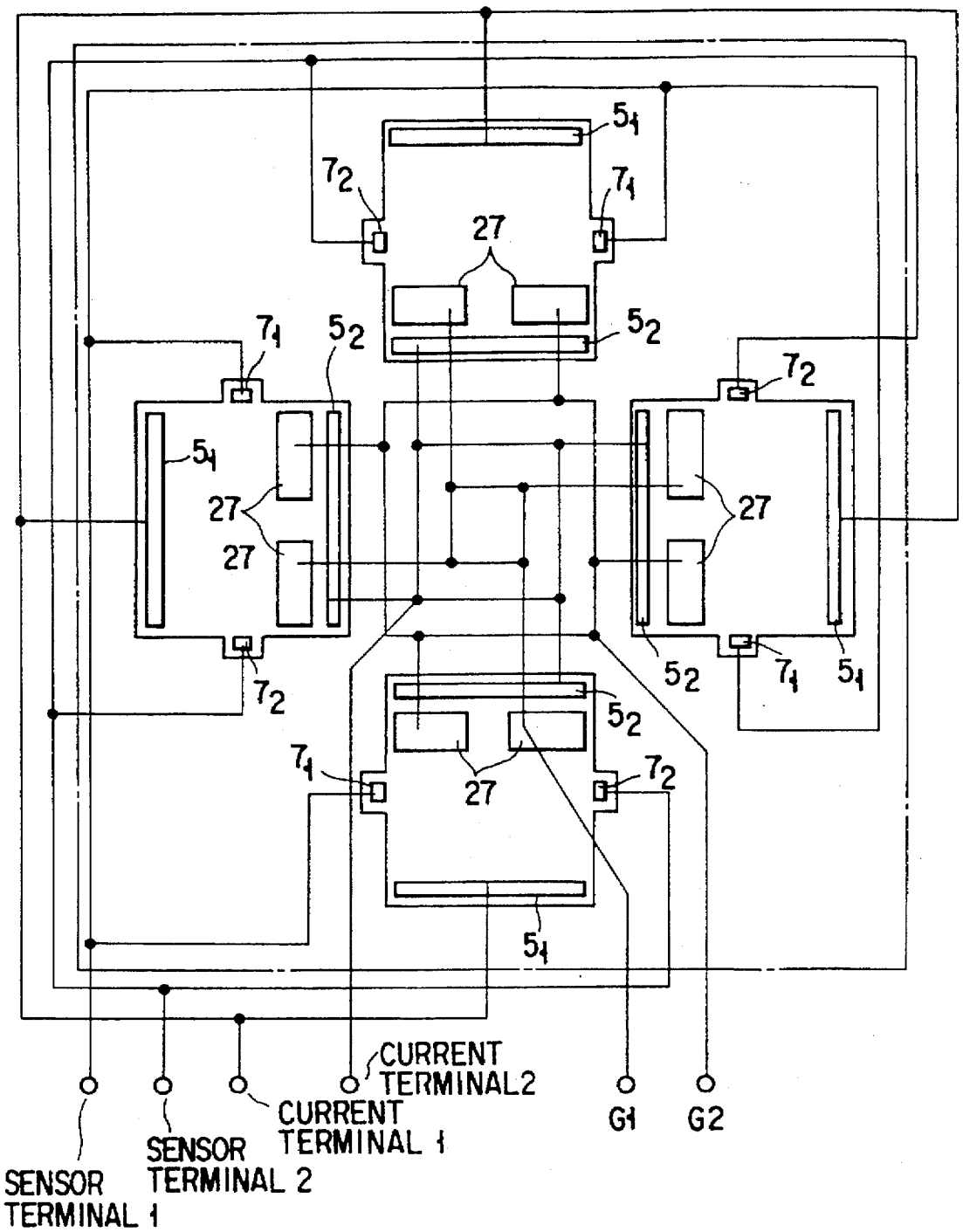
FIG. 24 is a connection diagram of a lateral Hall device according to an eleventh embodiment of this invention which permits the adjustment of an offset voltage from the exterior by using four lateral Hall elements of FIGS. 18A, 18B and making an orthogonal connection.

FIG. 24 is a top plan view showing a lateral Hall device according to an eleventh embodiment of this invention. In this embodiment., four lateral Hall elements are disposed with an inclination angle of 90 degrees with each other, current supply electrodes $5_1$, $5_2$ and sensor electrodes $7_1$, $7_2$ of the respective lateral Hall elements are connected in parallel in an orthogonal fashion, and the gate terminals 27 are connected in a desired manner so that a desired potential can be applied to the gate terminals and an offset voltage generated by the piezo resistance effect due to stress can be suppressed from the exterior. The offset voltage can be sufficiently adjusted by use of one gate terminal, but by combining the connections of a plurality of gate terminals 27, the degree and width of variations in the gate terminal voltage and offset voltage adjustment can be selected. In the example of the structure shown in FIG. 24, four lateral Hall elements each of which is the same as the lateral Hall element of FIGS. 18A, 18B (ninth embodiment) are used, two gate terminals 27 of the respective lateral Hall elements are connected in parallel and used as $G_1$ and $G_2$ terminals, respectively, and the offset voltage can be adjusted by applying a voltage to the terminals from the exterior. The $G_1$ terminal is used to adjust the offset voltage in a positive voltage region and the $G_2$ terminal is used to adjust the negative offset voltage. The lateral Hall element having the MOS gate structure of FIGS. 23A, 23B (tenth embodiment) can be applied to the lateral Hall device of this embodiment.

(Twelfth Embodiment)

Figure 25:
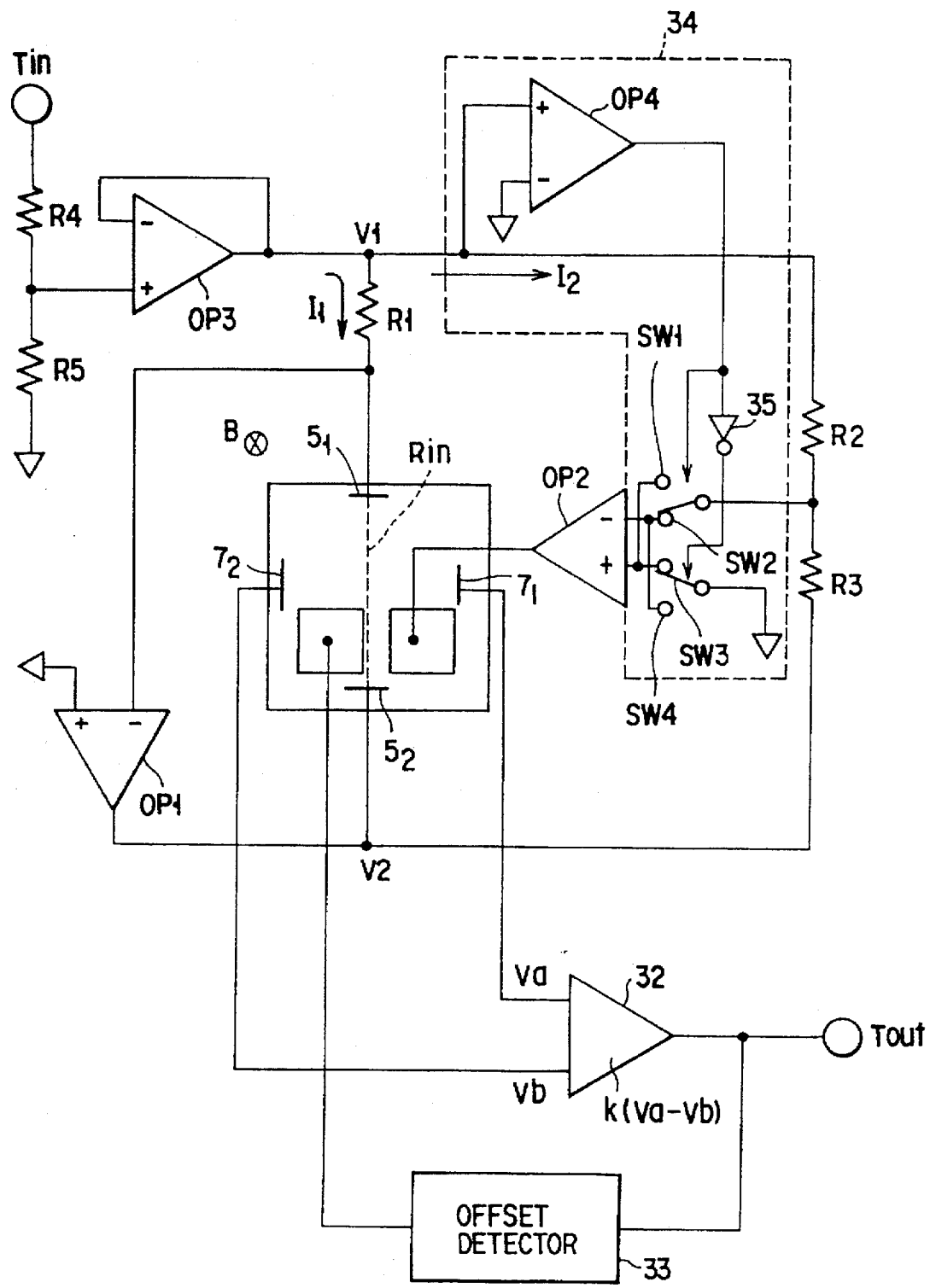
FIG. 25 is a circuit diagram showing an example of a watt-hour meter by using any one of the lateral Hall elements of the above embodiments.

FIG. 25 is a circuit diagram showing a domestic watt-hour meter according to a twelfth embodiment and having one of the lateral Hall elements of the above embodiments mounted thereon. Specifically, the lateral Hall element shown in FIGS. 18A, 18B (ninth embodiment) having the gate terminals 27, for example, is used in FIG. 25. B indicates an application magnetic field which varies in proportion to a current in the to-be-measured system and is converted by means of a core or the like. $T_{in}$ indicates a voltage input terminal used for inputting a voltage of the to-be-measured system and is normally applied with a voltage of AC 100 V. Resistors $R_4$, $R_5$ constitute an attenuator which converts the voltage of the to-be-measured system to a voltage level suitable for the internal circuit of this device. A third operational amplifier OP3 which acts as a buffer outputs a voltage $V_1$ which varies in proportion to the voltage of the to-be-measured system. The voltage $V_1$ is an AC or DC voltage which will fluctuate.

A first operational amplifier OP1 passes a current which varies in proportion to the voltage of the to-be-measure system between a pair of current input terminals $5_1$, $5_2$, and specifically, it passes a current $I_1$ expressed by the following equation (1) between the current supply electrodes $5_1$ and $5_2$ in the Hall element by outputting a voltage $V_2$ to the current supply electrode $5_2$ to keep the potential of the current supply electrode $5_1$ at 0.

$$x_1 = V_1/R_1 \quad \ldots (1)$$

The output voltage $V_2$ of the first operational amplifier OP1 is expressed by the following equation (2).

$$V_2 = I_1 \cdot R_{in} \quad \ldots (2)$$

where $R_{in}$ indicates a resistance of a portion of the Hall element which lies between the pair of current supply electrodes 51 and 52. A subtracter 32 multiplies a difference $(V_a - V_b)$ between Hall voltages occurring at a pair of sensor electrodes $7_1$, $7_2$ in the lateral Hall element by k and outputs the result of multiplication to an output terminal $T_{out}$. Since the voltage difference $(V_a - V_b)$ is a value which varies in proportion to the electric power of the to-be-measured system, the electric power of the to-be-measured system can be measured by reading the output voltage of the output terminal $T_{out}$. An offset detector 33 detects offset voltages appearing at the sensor electrodes $7_1$, $7_2$ and effects the feedback control for applying a compensation voltage to one of the gate terminals 27 to compensate for the offset. The offset detector 33 and one of the gate terminals 27 which is connected to the offset detector constitute offset compensating means. In the Hall element of this embodiment, a bridge circuit is constructed by four equivalent resistors $r_a$ to $r_d$, that is, an equivalent resistor $r_a$ between the current supply electrode $5_1$ and the sensor electrode $7_1$, an equivalent resistor $r_b$ between the current supply electrode $5_1$ and the sensor electrode $7_2$, an equivalent resistor $r_c$ between the sensor electrode $7_1$ and the current supply electrode $5_2$, and an equivalent resistor $r_d$ between the sensor electrode $7_2$ and the current supply electrode $5_2$, and the offset adjustment can be effected by adjusting the resistance of the equivalent resistor $r_d$ of the bridge circuit. Further, in order to maintain the input resistance $R_{in}$ of the Hall element at a constant value by changing the resistances of the equivalent resistor $r_c$ when the resistance of the equivalent resistor $r_d$ is varied by the offset compensating means to effect the offset compensation, input resistance control means is constructed by a second operational amplifier OP2, resistors $R_2$, $R_3$ and the other one of the gate terminals 27. Further, the resistance $R_{in}$ is set at a fixed value in order to provide constant sensitivity.

When the voltage $V_1$ is an AC voltage, a polarity switching unit 34 effects the negative feedback for the input of the second operational amplifier OP2 and it is constructed by a fourth operational amplifier OP4 acting as a comparator, inverter 35 and switches SW1 to SW4. The polarity switching unit 34 controls the ON/OFF positions of the switches SW1 to SW4 according to the polarity of the voltage $V_1$ as shown in the following table 1 to selectively connect the connection node between the resistors $R_2$ and $R_3$ to the inverting input terminal or non-inverting input terminal of the second operational amplifier OP2.

TABLE 1

| $V_1$ | SW1 | SW2 | SW3 | SW4 |
| --- | --- | --- | --- | --- |
| positive | ON | OFF | OFF | ON |
| negative | OFF | ON | ON | OFF |

The second operational amplifier OP2 functions to maintain the resistance $R_{in}$ of the Hall element between the pair of current supply electrodes $5_1$ and $5_2$ at a constant value, and specifically, it adjusts the width of the depletion layer in the active layer 2 by applying an output voltage to the other one of the gate terminals 27 to maintain the potential at the connection node between the resistors $R_2$ and $R_3$ at 0. Further, if the resistance $R_{in}$ of the Hall element is controlled to a constant value by adjusting the width of the depletion layer, a current $I_2$ flowing in the resistors $R_2$, $R_3$ is adjusted in the relation indicated by the following equation (3).

$$I_2 = V_1/R_2 = V_2/R_3 \quad \ldots (3)$$

$V_2$ can be expressed by the following equation (4) by substituting the equation (1) into the equation (2).

$$V_2 = V_1 \cdot R_{in}/R_1 \quad \ldots (4)$$

The following equation (5) can be derived by eliminating $V_1$, $V_2$ from the equations (3) and (4).

$$R_{in} = R_1 R_3/R_2 \quad \ldots (5)$$

That is, with the above construction, the input resistance control means constructed by the second operational amplifier OP2 controls the input resistance $R_{in}$ to a constant value as indicated by the following equation (5) irrespective of whether the voltage $V_1$ is AC or DC.

As a result, a fluctuation in the measurement sensitivity can be prevented even when the resistance of one equivalent resistor $r_c$ is varied to compensate for the offset voltage and suppress the offset voltage to 0.

TABLE 2

| Current [A] | error (%) | |
|---|---|---|
| | power factor 1.0 | power factor 0.5 |
| 30 | 0.00 | 0.18 |
| 15 | 0.17 | 0.40 |
| 6 | 0.51 | 0.51 |
| 3 | 0.50 | 0.76 |
| 2 | 0.64 | 0.76 |
| 1 | 0.62 | — |
| characteristic value | 0.70 | 0.58 |

The above table 2 indicates the current characteristic in a case where the lateral Hall element of this embodiment is mounted on a domestic watt-hour meter. The range of measurement current is 1 to 30 A. A result that the power measurement error is 0.7% when the power factor is 1.0 can be obtained. As the lateral Hall element of this embodiment, the lateral Hall element having the MOS gate structure in FIGS. 23A, 23B (tenth embodiment) can be applied.

The embodiments of this invention are explained above, but this invention is not limited to the above embodiments, and this invention can be variously modified without departing from the technical scope thereof.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A lateral Hall element comprising:

a second-conductivity type substrate;

a first-conductivity type active layer formed on said substrate;

a second-conductivity type semiconductor layer formed to surround said first-conductivity type active layer and formed to a depth to reach said substrate;

a pair of first first-conductivity type semiconductor layers of higher impurity concentration than said active layer selectively formed with a preset distance apart from each other on the surface of said first-conductivity type active layer;

current supply electrodes respectively formed on said pair of first first-conductivity type semiconductor layers;

a pair of second first-conductivity type semiconductor layers of higher impurity concentration than said active layer formed with a preset distance apart from each other on the surface of said first-conductivity type active layer in a position different from said first first-conductivity type semiconductor layer;

sensor electrodes respectively formed on said pair of second first-conductivity type semiconductor layers; and a third first-conductivity type semiconductor layer having a resistance lower than the first-conductivity type active layer and formed selectively or entirely between said first-conductivity type active layer and said substrate.

2. A lateral Hall element comprising:

a substrate;

a first-conductivity type active layer formed on said substrate;

a pair of first first-conductivity type semiconductor layers of higher impurity concentration than said active layer selectively formed with a preset distance apart from each other on the surface of said first-conductivity type active layer;

current supply electrodes respectively formed on said pair of first first-conductivity type semiconductor layers;

a pair of second first-conductivity type semiconductor layers of high impurity concentration formed with a preset distance apart from each other on the surface of said first-conductivity type active layer in a position different from said first first-conductivity type semiconductor layers;

sensor electrodes respectively formed on said pair of second first-conductivity type semiconductor layers;

an element isolation layer formed to surround said first-conductivity type active layer and formed to a depth to reach said substrate; and an insulating film formed between said first-conductivity type active layer and said substrate.

3. A lateral Hall element comprising:

a second-conductivity type substrate;

a first-conductivity type active layer formed on said second-conductivity type substrate;

a pair of first first-conductivity type semiconductor layers of higher impurity concentration than said active layer selectively formed with a preset distance apart from each other on the surface of said first-conductivity type active layer;

current supply electrodes respectively formed on said pair of first first-conductivity type semiconductor layers;

a pair of second first-conductivity type semiconductor layers of higher impurity concentration than said active layer formed with a preset distance apart from each other on the surface of said first-conductivity type active layer in a position different from said first first-conductivity type semiconductor layers;

sensor electrodes respectively formed on said pair of second first-conductivity type semiconductor layers;

a third first-conductivity type semiconductor layer formed between said first-conductivity type active layer and said second-conductivity type substrate; and a first second-conductivity type semiconductor layer having a resistance lower than said first-conductivity type active layer and selectively formed on said third first-conductivity type semiconductor layer;

wherein a second second-conductivity type semiconductor layer is formed to surround said first and second first-conductivity type semiconductor layers and formed from the surface of said first-conductivity type active layer to a depth to reach said first second-conductivity type semiconductor layer.

4. A lateral Hall element comprising:

a substrate;

a first-conductivity type active layer formed on said substrate;

a pair of first first-conductivity type semiconductor layers of higher impurity concentration than said active layer selectively formed with a preset distance apart from each other on the surface of said first-conductivity type active layer;

current supply electrodes respectively formed on said pair of first first-conductivity type semiconductor layers;

a pair of second first-conductivity type semiconductor layers of higher impurity concentration than said active layer formed with a preset distance apart from each other on the surface of said first-conductivity type active layer in a position different from said first first-conductivity type semiconductor layers;

sensor electrodes respectively formed on said pair of second first-conductivity type semiconductor layers;

a plurality of second-conductivity type semiconductor layers formed on the surface of said first-conductivity type active layer in a position different from said first and second first-conductivity type semiconductor layers;

gate electrodes respectively formed on said second-conductivity type semiconductor layers;

an element isolation layer formed to surround said first-conductivity type active layer and formed to a depth to reach said substrate; and an insulating film formed between said first-conductivity type active layer and said substrate.

5. A lateral Hall element comprising:

a substrate;

a first-conductivity type active layer formed on said substrate;

a pair of first first-conductivity type semiconductor layers of higher impurity concentration than said active layer selectively formed with a preset distance apart from each other on the surface of said first-conductivity type active layer;

current supply electrodes respectively formed on said pair of first first-conductivity type semiconductor layers;

a pair of second first-conductivity type semiconductor layers of higher impurity concentration than said active layer formed with a preset distance apart from each other on the surface of said first-conductivity type active layer in a position different from said first first-conductivity type semiconductor layers;

sensor electrodes respectively formed on said pair of second first-conductivity type semiconductor layers;

a plurality of second-conductivity type semiconductor layers formed on the surface of said first-conductivity type active layer in a position different from said first and second first-conductivity type semiconductor layers;

gate electrodes respectively formed on said second-conductivity type semiconductor layers;

an element isolation layer formed to surround said first-conductivity type active layer and formed to a depth to reach said substrate; and an insulating film formed between said first-conductivity type active layer and said substrate;

wherein said first-conductivity type active layer has a thickness ranging from 3.5 to 6 µm, and said second-conductivity type active layer has a thickness of 1 µm at most.

6. A lateral Hall element comprising:

a substrate;

a first-conductivity type active layer formed on said substrate;

a pair of first first-conductivity type semiconductor layers of higher impurity concentration than said active layer selectively formed with a preset distance apart from each other on the surface of said first-conductivity type active layer;

current supply electrodes respectively formed on said pair of first first-conductivity type semiconductor layers;

a pair of second first-conductivity type semiconductor layers of higher impurity concentration than said active layer formed with a preset distance apart from each other on the surface of said first-conductivity type active layer in a position different from said first first-conductivity type semiconductor layers;

sensor electrodes respectively formed on said pair of second first-conductivity type semiconductor layers;

an element isolation layer formed to surround said first-conductivity type active layer and formed to a depth to reach said substrate; and an insulating film formed between said first-conductivity type active layer and said substrate;

wherein said first-conductivity type active layer has a thickness ranging from 0.5 to 9 µm.

7. A lateral Hall element comprising:

a first-conductivity type substrate;

a first-conductivity type active layer formed on said first-conductivity type substrate;

a pair of first first-conductivity type semiconductor layers of higher impurity concentration than said active layer selectively formed with a preset distance apart from each other on the surface of said first-conductivity type active layer;

current supply electrodes respectively formed on said pair of first first-conductivity type semiconductor layers;

a pair of second first-conductivity type semiconductor layers of higher impurity concentration than said active layer formed with a preset distance apart from each other on the surface of said first-conductivity type active layer in a position different from said first first-conductivity type semiconductor layers;

sensor electrodes respectively formed on said pair of second first-conductivity type semiconductor layers;

a first second-conductivity type semiconductor layer formed between said first-conductivity type active layer and said first-conductivity type substrate; and a second second-conductivity type semiconductor layer formed from the surface of said first-conductivity type active layer to a depth to reach said first second-conductivity type semiconductor layer to surround said first and second first-conductivity type semiconductor layers;

wherein said first second-conductivity type semiconductor layer has a thickness ranging from 1.5 to 3 µm.

8. A lateral Hall element according to claim 2, further comprising a gate insulation film formed on a portion of said first-conductivity type active layer which is surrounded by said element isolation layer; and a plurality of gate electrodes formed on said gate insulation film in a position different from said current supply electrodes and said sensor electrodes.

9. A lateral Hall device comprising:

four lateral Hall elements, each comprising:

a substrate;

a first-conductivity type active layer formed on said substrate;

a pair of first first-conductivity type semiconductor layers of higher impurity concentration than said active layer selectively formed with a preset distance apart from each other on the surface of said first-conductivity type active layer;

current supply electrodes respectively formed on said pair of first first-conductivity type semiconductor layers;

a pair of second first-conductivity type semiconductor layers of higher impurity concentration than said active layer formed with a preset distance apart from each other on the surface of said first-conductivity type active layer in a position different from said first first-conductivity type semiconductor layers;

sensor electrodes respectively formed on said pair of second first-conductivity type semiconductor layers;

a plurality of second-conductivity type semiconductor layers formed on the surface of said first-conductivity type active layer in a position different from said first and second first-conductivity type semiconductor layers;

gate electrodes respectively formed on said second-conductivity type semiconductor layers;

an element isolation layer formed to surround said first-conductivity type active layer and formed to a depth to reach said substrate; and an insulating film formed between said first-conductivity type active layer and said substrate, wherein said lateral Hall elements are arranged with an inclination angle of 90 degrees with each other, corresponding one of said current supply electrodes of said lateral Hall elements are connected in parallel in an orthogonal fashion, corresponding ones of said sensor electrodes of said lateral Hall elements are connected in parallel in an orthogonal fashion, and said gate electrodes of said lateral Hall elements are connected in a desired fashion.

10. A lateral Hall device comprising:

four lateral Hall elements, each comprising:

a substrate;

a first-conductivity type active layer formed on said substrate;

a pair of first first-conductivity type semiconductor layers of higher impurity concentration than said active layer selectively formed with a preset distance apart from each other on the surface of said first-conductivity type active layer;

current supply electrodes respectively formed on said pair of first first-conductivity type semiconductor layers;

a pair of second first-conductivity type semiconductor layers of higher impurity concentration than said active layer formed with a preset distance apart from each other on the surface of said first-conductivity type active layer in a position different from said first first-conductivity type semiconductor layers;

sensor electrodes respectively formed on said pair of second first-conductivity type semiconductor layers;

an element isolation layer formed to surround said first-conductivity type active layer and formed to a depth to reach said substrate;

an insulating film formed between said first-conductivity type active layer and said substrate;

a gate insulation film formed on a portion of said first-conductivity type active layer which is surrounded by said element isolation layer; and a plurality of gate electrodes formed on said gate insulation film in a position different from said current supply electrodes and said sensor electrodes, wherein said lateral Hall elements are arranged with an inclination angle of 90 degrees with each other, corresponding ones of said current supply electrodes of said lateral Hall elements are connected in parallel in an orthogonal fashion, corresponding ones of said sensor electrodes of said lateral Hall elements are connected in parallel in an orthogonal fashion, and said gate electrodes of said lateral Hall elements are connected in a desired fashion.

11. A lateral Hall element comprising:

a substrate;

a first-conductivity type active layer formed on said substrate;

a pair of first first-conductivity type semiconductor layers of higher impurity concentration than said active layer selectively formed with a preset distance apart from each other on the surface of said first-conductivity type active layer;

current supply electrodes respectively formed on said pair of first first-conductivity type semiconductor layers;

a pair of second first-conductivity type semiconductor layers of high impurity concentration formed with a preset distance apart from each other on the surface of said first-conductivity type active layer in a position different from said first first-conductivity type semiconductor layers;

sensor electrodes respectively formed on said pair of second first-conductivity type semiconductor layers;

a plurality of second-conductivity type semiconductor layers formed on the surface of said first-conductivity type active layer in a position different from said first and second first-conductivity type semiconductor layers;

gate electrodes respectively formed on said second-conductivity type semiconductor layers;

an element isolation layer formed to surround said first-conductivity type active layer and formed to a depth to reach said substrate; and an insulating film formed between said first-conductivity type active layer and said substrate, wherein said lateral Hall element is used as a power detection element by passing a current which is proportional to a voltage of a to-be-measured system between said pair of current supply electrodes, applying a magnetic field proportional to a current of the to-be-measured system, and deriving a Hall voltage proportional to the product of the voltage and current of the to-be-measured system between said pair of sensor electrodes.

12. A lateral Hall element comprising:

a substrate;

a first-conductivity type active layer formed on said substrate;

a pair of first first-conductivity type semiconductor layers of higher impurity concentration than said active layer selectively formed with a preset distance apart from each other on the surface of said first-conductivity type active layer;

current supply electrodes respectively formed on said pair of first first-conductivity type semiconductor layers;

a pair of second first-conductivity type semiconductor layers of higher impurity concentration than said active layer formed with a preset distance apart from each other on the surface of said first-conductivity type active layer in a position different from said first first-conductivity type semiconductor layers;

sensor electrodes respectively formed on said pair of second first-conductivity type semiconductor layers;

an element isolation layer formed to surround said first-conductivity type active layer and formed to a depth to reach said substrate;

an insulating film formed between said first-conductivity type active layer and said substrate;

a gate insulation film formed on a portion of said first-conductivity type active layer which is surrounded by said element isolation layer; and a plurality of gate electrodes formed on said gate insulation film in a position different from said current supply electrodes and said sensor electrodes, wherein said lateral Hall element is used as a power detection element by passing a current which is proportional to a voltage of a to-be-measured system between said pair of current supply electrodes, applying a magnetic field proportional to a current of the to-be-measured system, and deriving a Hall voltage proportional to the product of the voltage and current of the to-be-measured system between said pair of sensor electrodes.

13. A lateral Hall element according to claim 4, wherein a difference between a thickness of said first-conductivity type active layer and a thickness of said second-conductivity semiconductor layer lies in a range of 2 to 5 μm.

14. A lateral Hall element according to claim 2, wherein said insulating film has a thickness ranging from 0.3 to 2 μm.

15. A lateral Hall element according to claim 4, wherein said second-conductivity type semiconductor layers are formed in a position different from the intersection of a line connecting the centers of said pair of first first-conductivity type semiconductor layers and a line connecting the centers of said pair of second first-conductivity type semiconductor layers.

16. A lateral Hall element according to claim 4, wherein said second-conductivity type semiconductor layers are formed in a position deviated from a line connecting said pair of first first-conductivity type semiconductor layers to each other.

17. A lateral Hall element according to claim 4, wherein said second-conductivity type semiconductor layers are formed in a position deviated from a line connecting the centers of said pair of second first-conductivity type semiconductor layers.

18. A lateral Hall element according to claim 4, wherein said element isolation layer is formed of an insulating material or said second second-conductivity type semiconductor layer.

19. A lateral Hall element according to claim 2, wherein said element isolation layer is formed of an insulating material or said second second-conductivity type semiconductor layer.

* * * * *